United States Patent
Nakai et al.

(10) Patent No.: US 10,651,058 B2
(45) Date of Patent: May 12, 2020

(54) SUBSTRATE PROCESSING METHOD AND SUBSTRATE PROCESSING APPARATUS

(71) Applicant: SCREEN Holdings Co., Ltd., Kyoto (JP)

(72) Inventors: Hitoshi Nakai, Kyoto (JP); Yasunori Kanematsu, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 16/018,511

(22) Filed: Jun. 26, 2018

(65) Prior Publication Data

US 2019/0035650 A1 Jan. 31, 2019

(30) Foreign Application Priority Data

Jul. 31, 2017 (JP) .................. 2017-148111

(51) Int. Cl.
| | | |
|---|---|---|
| *H01L 21/67* | (2006.01) | |
| *H01L 21/687* | (2006.01) | |
| *H01L 21/02* | (2006.01) | |
| *H01L 21/683* | (2006.01) | |

(52) U.S. Cl.
CPC .. *H01L 21/67051* (2013.01); *H01L 21/02052* (2013.01); *H01L 21/02057* (2013.01); *H01L 21/6715* (2013.01); *H01L 21/67028* (2013.01); *H01L 21/67046* (2013.01); *H01L 21/68742* (2013.01); *H01L 21/68764* (2013.01); *H01L 21/67103* (2013.01); *H01L 21/6838* (2013.01)

(58) Field of Classification Search
CPC ................. H01L 21/67051; H01L 21/02052
See application file for complete search history.

(56) References Cited

U.S. PATENT DOCUMENTS

| | | | |
|---|---|---|---|
| 2008/0016714 A1* | 1/2008 | Kaneyama | H01L 21/67051 34/317 |
| 2008/0132037 A1 | 6/2008 | Furui | 438/465 |
| 2013/0008868 A1* | 1/2013 | Uozumi | G03F 7/162 216/41 |
| 2015/0064911 A1 | 3/2015 | Kaneko et al. | 438/694 |

FOREIGN PATENT DOCUMENTS

| | | |
|---|---|---|
| JP | 2000-156362 A | 6/2000 |
| JP | 2015-149410 A | 8/2015 |
| JP | 2016-197762 A | 11/2016 |
| JP | 2017-050576 A | 3/2017 |
| KR | 10-2008-0049607 A | 6/2008 |

* cited by examiner

*Primary Examiner* — Dah-Wei D. Yuan
*Assistant Examiner* — Kristen A Dagenais-Englehart
(74) *Attorney, Agent, or Firm* — Ostrolenk Faber LLP

(57) ABSTRACT

A substrate processing method includes a substrate holding step of horizontally holding a substrate having a first major surface and a second major surface at an opposite side of the first major surface, a coating film forming step of supplying a coating agent to the first major surface to form a sublimating coating film which covers the first major surface, and a coating film cleaning step of cleaning a front surface of the coating film.

16 Claims, 16 Drawing Sheets

FIG. 8A  Rinse liquid replacing step (S3)
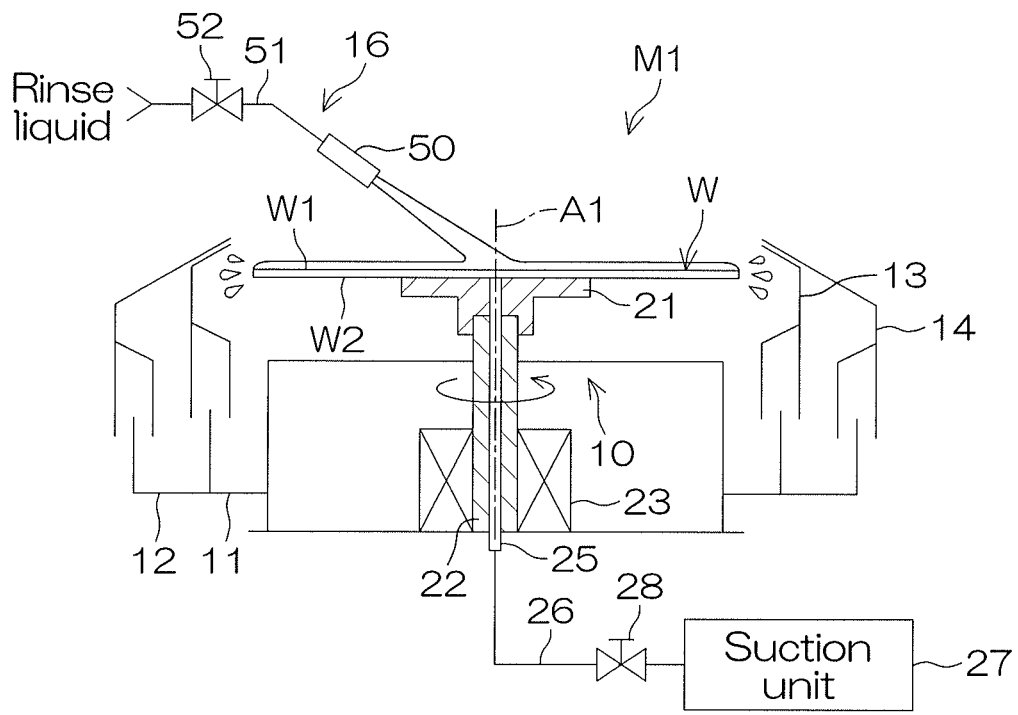
FIG. 8B  Organic solvent replacing step (S4)
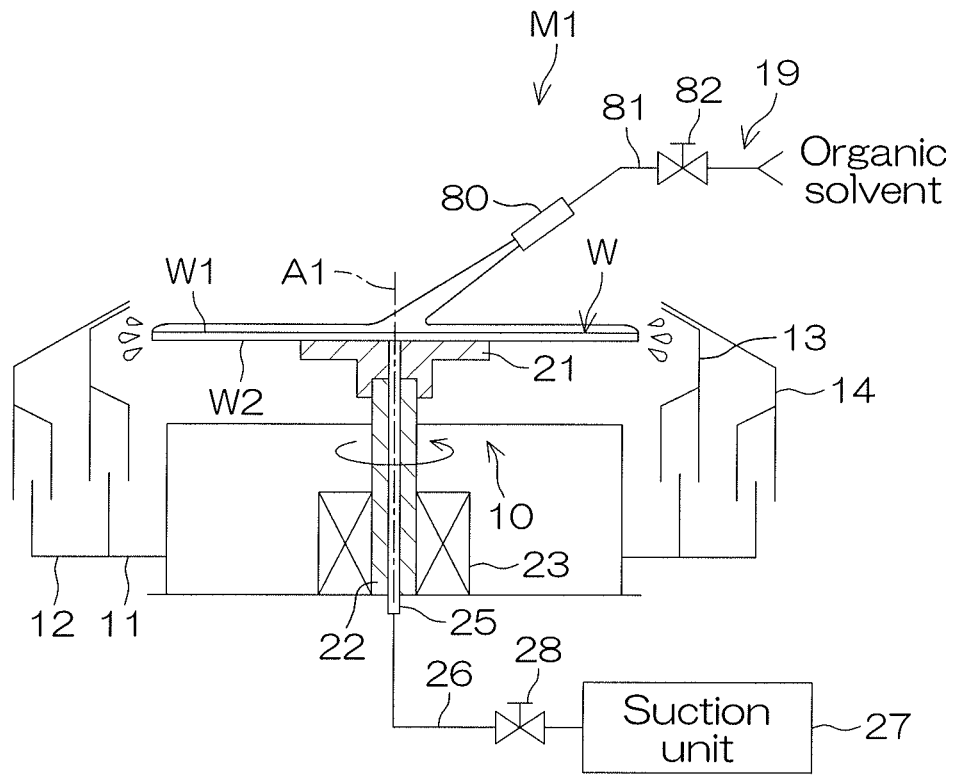

FIG. 8C Coating agent supplying step (S5)
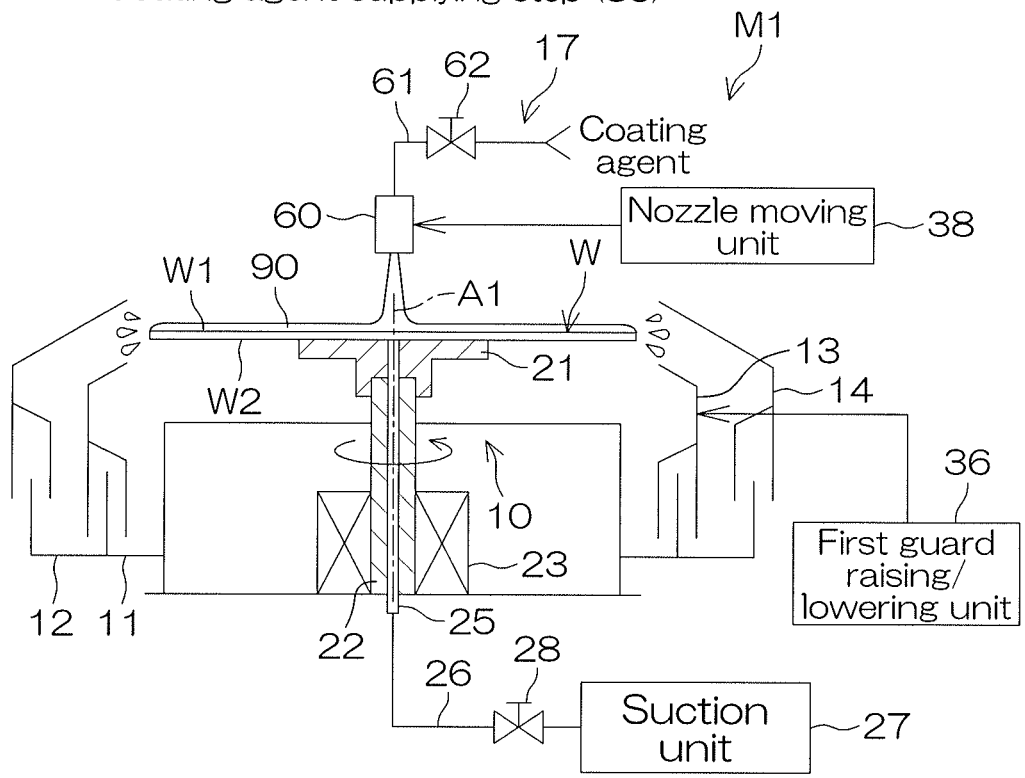
FIG. 8D Peripheral edge cleaning step (S6)
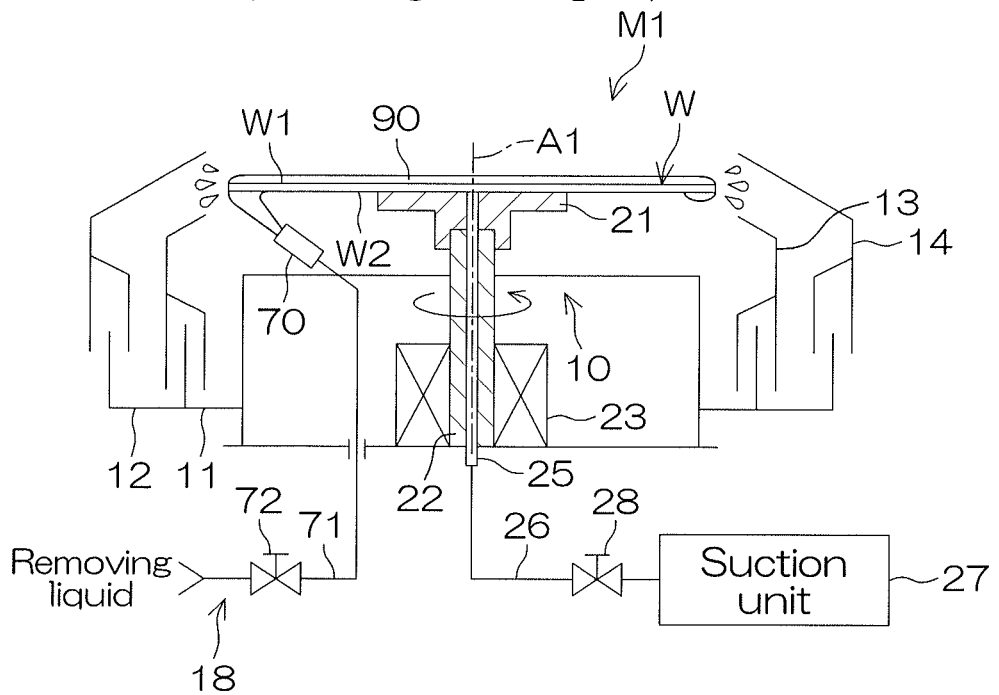

FIG. 8E  First substrate heating step (S9)
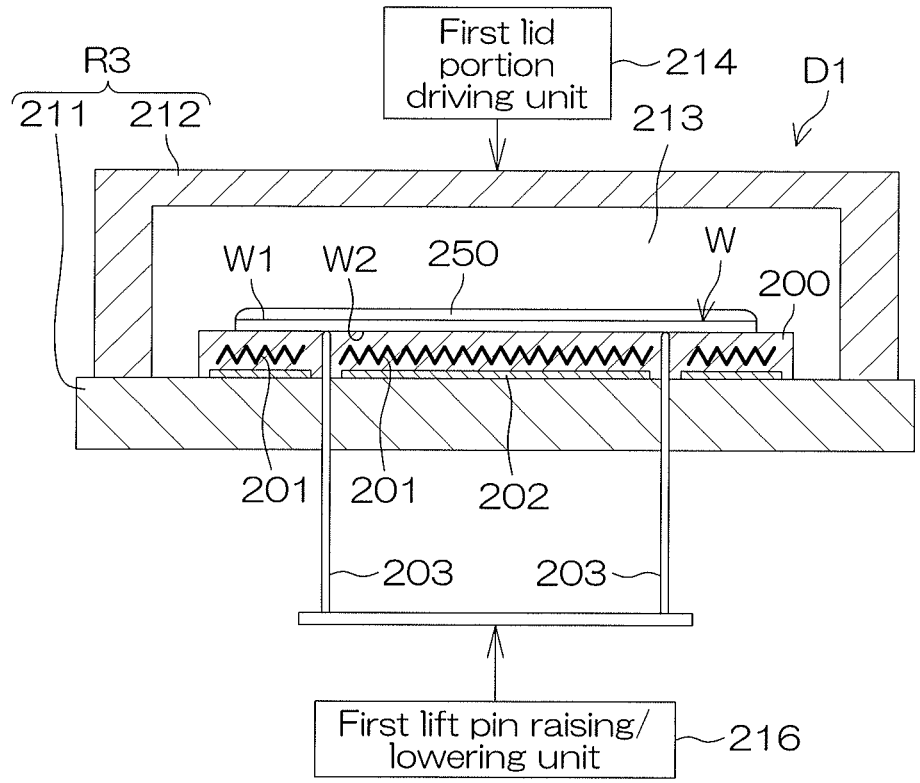
FIG. 8F  Second major surface cleaning step (S12)
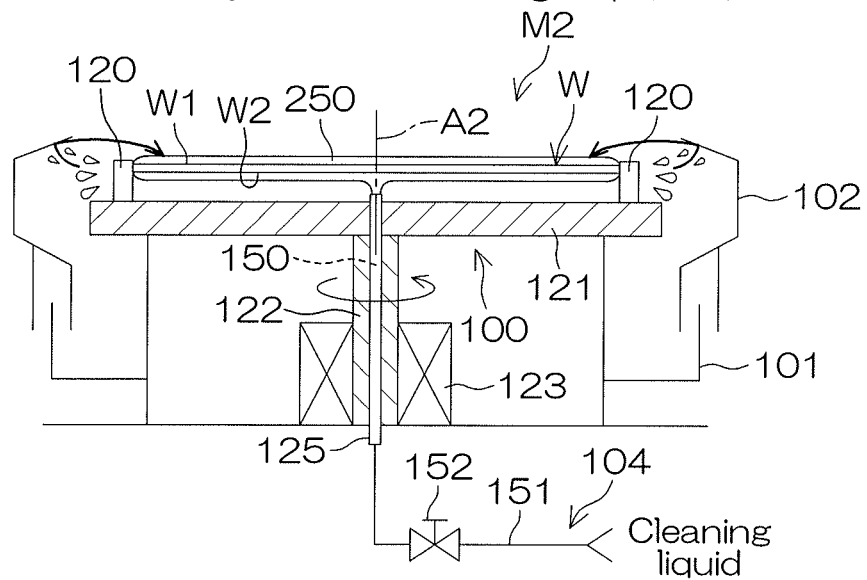

FIG. 8G  Coating film cleaning step (S13)
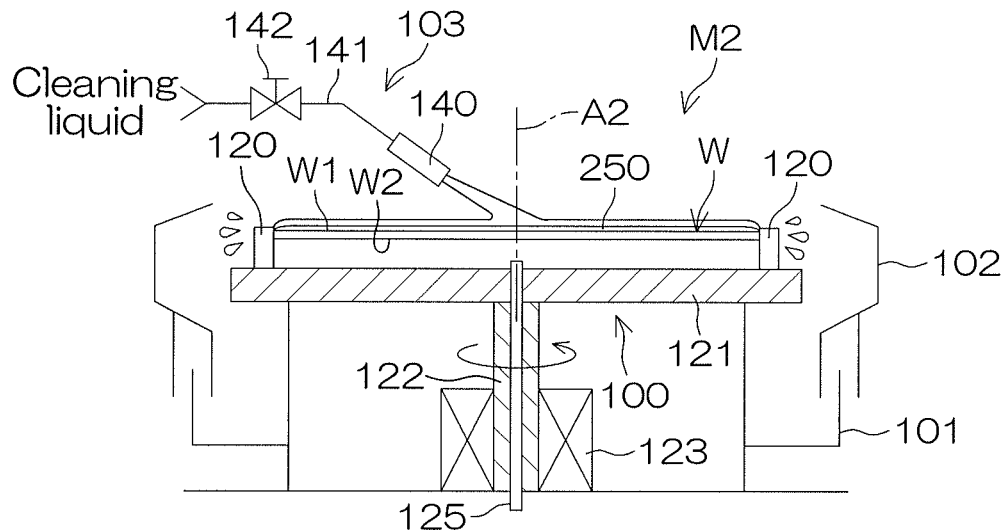
FIG. 8H  Second substrate heating step (S18)
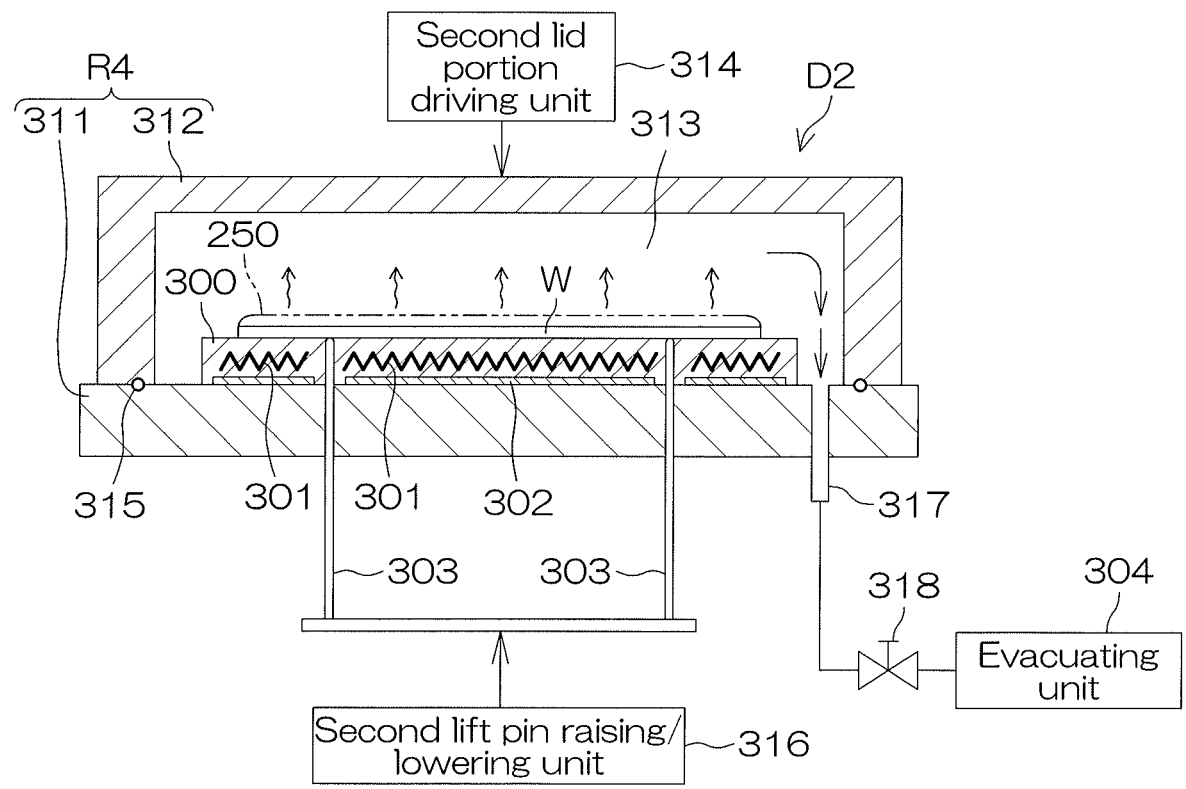

FIG. 9A  Before coating film cleaning step (S13)
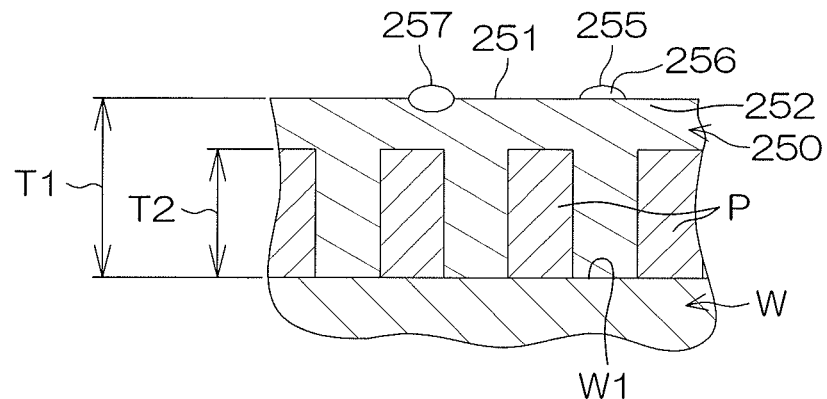
FIG. 9B  After coating film cleaning step (S13)
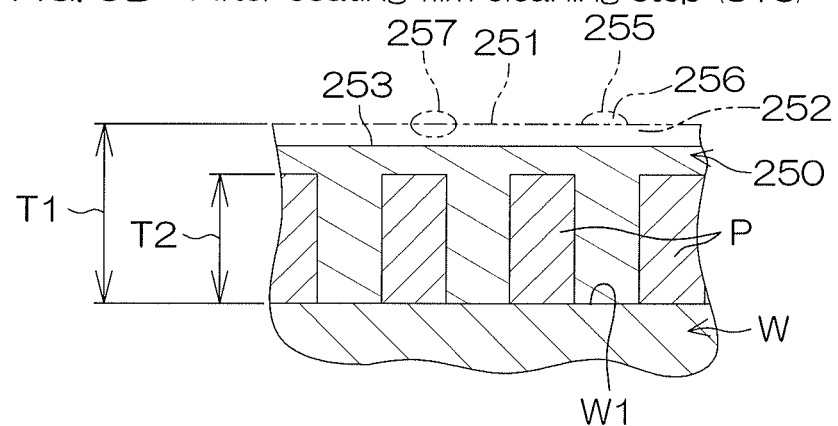
FIG. 10
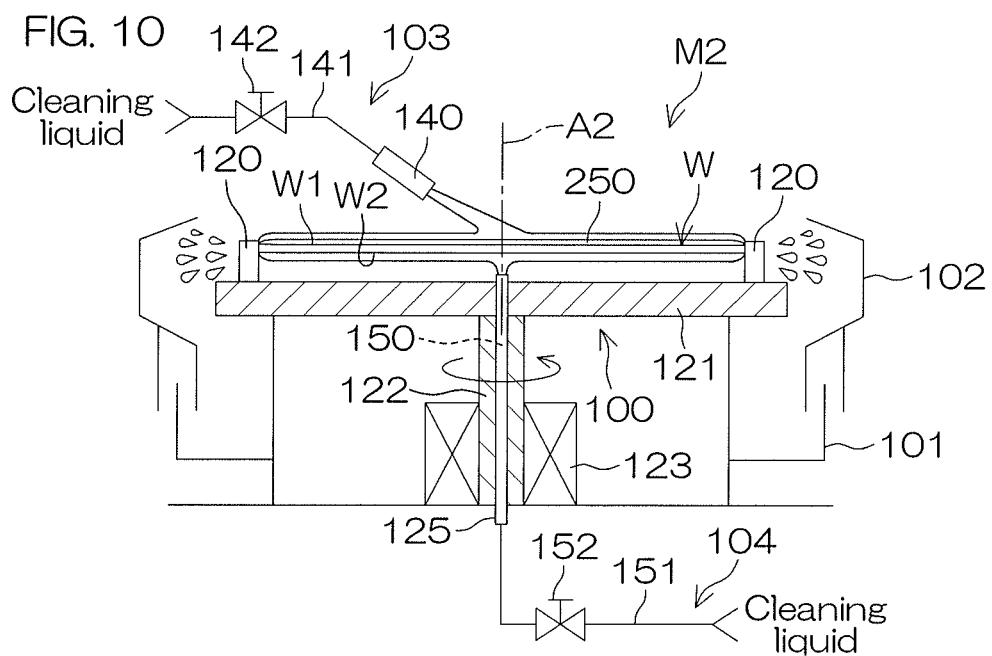

SUBSTRATE PROCESSING METHOD AND SUBSTRATE PROCESSING APPARATUS

BACKGROUND OF THE INVENTION

1. Field of the Invention

The present invention relates to a substrate processing method and a substrate processing apparatus for processing substrates. Examples of substrates to be processed include substrates, such as semiconductor wafers, substrates for liquid crystal displays, substrates for FPDs (flat panel displays), such as organic EL (electroluminescence) display devices, etc., substrates for optical disks, substrates for magnetic disks, substrates for magneto-optical disks, substrates for photomasks, ceramic substrates, substrates for solar cells, etc.

2. Description of the Related Art

In substrate processing by a single substrate processing type substrate processing apparatus, substrates are processed one by one. In detail, a substrate is held substantially horizontally by a spin chuck. Then, after a major surface of the substrate is cleaned by a chemical liquid, the major surface is rinsed by a rinsing liquid. Thereafter, a spin drying step of eliminating the rinse liquid from the substrate is performed (see, for example, Japanese Patent Application Publication No. 2000-156362).

By processing the major surface of the substrate with a chemical liquid, a metal pattern is exposed on the major surface of the substrate. When the substrate is left to stand for a long time in the state where the metal pattern is exposed, the metal pattern may become oxidized. Thus, in Japanese Patent Application Publication No. 2016-197762 and Japanese Patent Application Publication No. 2015-149410, a substrate processing method where a topcoat film, which covers a major surface of a substrate, is formed is disclosed. Oxidation of a metal pattern is thereby suppressed. To apply further processing to the major surface of the substrate, the topcoat film is removed.

A method where, after removing the topcoat film by a removing liquid, the major surface of the substrate is cleaned by a rinse liquid is described in Japanese Patent Application Publication No. 2016-197762. On the other hand, a method where the topcoat film is removed by sublimation is described in Japanese Patent Application Publication No. 2015-149410 (fourth preferred embodiment).

SUMMARY OF THE INVENTION

With the substrate processing described in Japanese Patent Application Publication No. 2016-197762, when spinning off the rinse liquid, it may not be possible to remove the rinse liquid that entered in between a metal pattern formed on the major surface of the substrate. Drying failure may occur thereby. A liquid surface (interface between air and liquid) of the rinse liquid that entered in an interior of the metal pattern is formed inside the metal pattern and therefore a surface tension of the liquid acts on a position of contact of the liquid surface and the metal pattern. The metal pattern may collapse due to the surface tension.

With the substrate processing of Japanese Patent Application Publication No. 2015-149410 (fourth preferred embodiment), unlike in the substrate processing of Japanese Patent Application Publication No. 2016-197762, a liquid is not used to remove the topcoat film. Collapse of a metal pattern can thus be suppressed. However, if the topcoat film is sublimated when a front surface of the topcoat film is contaminated, the contaminant (a particle) attached to the front surface of the topcoat film may remain on the major surface of the substrate.

Thus, an object of the present invention is to provide a substrate processing method and a substrate processing apparatus with which, in a configuration where a coating film is formed on a major surface of a substrate, contamination of the major surface can be suppressed.

A preferred embodiment of the present invention provides a substrate processing method including a substrate holding step of horizontally holding a substrate having a first major surface and a second major surface at an opposite side of the first major surface, a coating film forming step of supplying a coating agent to the first major surface to form a sublimating coating film which covers the first major surface, and a coating film cleaning step of cleaning a front surface of the coating film.

With the present method, the sublimating coating film is formed in the coating film forming step. The coating film can thus be removed from the first major surface without using a liquid for removing the coating film from the first major surface. Also, the front surface of the sublimating coating film is cleaned in the coating film cleaning step. Therefore, even if the coating film is sublimated after the coating film cleaning step, a contaminant attached to the front surface of the coating film can be suppressed from remaining on the first major surface. Contamination of the first major surface of the substrate can thus be suppressed.

In the preferred embodiment of the present invention, the substrate processing method further includes a second major surface cleaning step of cleaning the second major surface after the end of the coating film forming step. Also, the coating film cleaning step is started after the end of the second major surface cleaning step or is executed in parallel with the second major surface cleaning step.

With the present method, the second major surface is cleaned in the second major surface cleaning step. On the other hand, a cleaning liquid that landed on the second major surface may float around the substrate and become attached to the front surface of the coating film. The cleaning liquid that landed on the second major surface may also splash toward a member disposed around the substrate and be splashed back by the member and become attached to the front surface of the coating film. Further, the cleaning liquid that landed on the second major surface may also flow around to the first major surface side and become attached to the front surface of the coating film. The cleaning liquid that landed once on the second major surface may contain a contaminant, such as a particle, etc. A contaminant, such as a particle, etc., is even more likely to be contained in the cleaning liquid that is splashed back by the member disposed around the substrate.

With the present substrate processing method, the coating film cleaning step is started after the end of the second major surface cleaning step or the coating film cleaning step is executed in parallel with the second major surface cleaning step. Therefore, even if the cleaning liquid attaches to the front surface of the coating film due to the second major surface cleaning step, the front surface of the coating film is cleaned in the coating film cleaning step. Contamination of the first major surface can thus be suppressed in the substrate processing method in which the second major surface is cleaned by the second major surface cleaning step.

In the preferred embodiment of the present invention, the coating film cleaning step includes a first cleaning step of starting cleaning of the front surface of the coating film after the end of the second major surface cleaning step. Here, a predetermined time is required for the cleaning liquid that landed on the second major surface to reach the front surface of the coating film and therefore after the end of the second major surface cleaning step, there is a possibility of the cleaning liquid becoming attached to the front surface of the coating film until the predetermined time elapses. With a method where the cleaning of the front surface of the coating film is started after the second major surface cleaning step as in the present substrate processing method, the cleaning liquid attached to the front surface of the coating film due to the second major surface cleaning step can be removed reliably. Also, even if a contaminant is attached to the front surface of the coating film from before the start of the second major surface cleaning step, the contaminant can be removed at the same time as the cleaning liquid attached to the front surface of the coating film due to the second major surface cleaning step.

In the preferred embodiment of the present invention, the coating film cleaning step includes a second cleaning step of cleaning the front surface of the coating film in parallel with the second major surface cleaning step.

The cleaning liquid attached to the front surface of the coating film due to the second major surface cleaning step can thus be removed immediately. If a contaminant is already attached to the front surface of the coating film before the start of the second major surface cleaning step, removal of the contaminant can be started before the cleaning liquid that landed on the second major surface reaches the front surface of the coating film. Further, time until end of the coating film cleaning step can also be shortened. The number of substrates that can be processed per unit time can thus be increased. That is, improvement of throughput can be achieved, and contamination of the first major surface can thus be suppressed while achieving improvement of throughput.

The predetermined time is required for the cleaning liquid that landed on the second major surface to reach the front surface of the coating film and therefore after the end of the second major surface cleaning step, there is a possibility of the cleaning liquid becoming attached to the front surface of the coating film until the predetermined time elapses. Thus, with the preferred embodiment of the present invention, the second cleaning step is ended after the end of the second major surface cleaning step. Attachment of contaminated cleaning liquid to the front surface of the coating film after the end of the coating film cleaning step can thus be suppressed further.

In the preferred embodiment of the present invention, the substrate processing method further includes a protective liquid supplying step of supplying a protective liquid, which protects the front surface of the coating film, to the front surface of the coating film. The protective liquid supplying step is executed in parallel with the second major surface cleaning step before the start of the coating film cleaning step. Attachment of contaminated cleaning liquid to the front surface of the coating film is thus suppressed by the protective liquid. Contamination of the first major surface can thus be suppressed.

In the preferred embodiment of the present invention, the coating film cleaning step includes a step of supplying a cleaning liquid to the front surface of the coating film to clean the front surface of the coating film. The cleaning liquid supplied to the front surface of the coating film in the coating film cleaning step spreads on the front surface of the coating film. A cleaning time of the front surface of the coating film can thus be reduced.

In the preferred embodiment of the present invention, the coating film cleaning step includes a step of removing a surface layer of the coating film. Here, there may be a case where a particle becomes firmly attached to the front surface of the coating film, thus making it difficult to remove the particle from the front surface of the coating film. Even in such a case, the particle can be removed together with the surface layer of the coating film in the coating film cleaning step. The front surface of the coating film can thus be cleaned reliably.

In the preferred embodiment of the present invention, the coating film forming step includes a solidifying step of heating the substrate, after the coating agent is supplied to the first major surface, to solidify the coating agent and form the coating film. The coating film can thus be formed reliably.

Here, the coating agent supplied to the first major surface may flow around to the second major surface from a peripheral edge portion of the first major surface and become attached to a peripheral edge portion of the second major surface. In the preferred embodiment of the present invention, the substrate processing method further includes a peripheral edge cleaning step of cleaning a peripheral edge of the second major surface before start of the solidifying step. Contamination of the second major surface by the coating agent can thus be suppressed.

In the preferred embodiment of the present invention, the substrate processing method further includes a sublimating step of sublimating the coating film after the end of the coating film cleaning step. Therefore, the coating film is sublimated and the first major surface becomes exposed. The front surface of the coating film is cleaned in the coating film cleaning step and therefore a contaminant attached to the front surface of the coating film can be suppressed from remaining on the first major surface after sublimation of the coating film. That is, contamination of the first major surface is suppressed.

In the preferred embodiment of the present invention, a metal pattern is formed on the first major surface. Therefore, with the substrate processing method, where the sublimating coating film is formed on the first major surface and the front surface of the coating film is cleaned, contamination of the first major surface can be suppressed while suppressing collapse of the metal pattern.

A preferred embodiment of the present invention provides a substrate processing apparatus including a substrate holding unit which horizontally holds a substrate having a first major surface and a second major surface at an opposite side of the first major surface, a coating agent supplying unit which supplies a coating agent, capable of forming a sublimating coating film which covers the first major surface, to the first major surface, a coating film cleaning unit which cleans a front surface of the coating film, and a controller which controls the substrate holding unit, the coating agent supplying unit, and the coating film cleaning unit, and where the controller is programmed to execute a substrate holding step, in which the substrate is held horizontally by the substrate holding unit, a coating film forming step of supplying the coating agent from the coating agent supplying unit to the first major surface to form the coating film, and a coating film cleaning step, in which the front surface of the coating film is cleaned by the coating film cleaning unit.

With the present apparatus, the sublimating coating film is formed in the coating film forming step. The coating film can thus be removed from the first major surface without using a liquid for removing the coating film from the first major surface. Also, the front surface of the sublimating coating film is cleaned in the coating film cleaning step. Therefore, even if the coating film is sublimated after the coating film cleaning step, a contaminant attached to the front surface of the coating film can be suppressed from remaining on the first major surface. Contamination of the first major surface of the substrate can thus be suppressed.

In the preferred embodiment of the present invention, the substrate processing apparatus further includes a second major surface cleaning unit, cleaning the second major surface. Also, the controller is programmed to further execute a second major surface cleaning step, in which the second major surface is cleaned by the second major surface cleaning unit after end of the coating film forming step. Further, the controller is programmed to start the coating film cleaning step after the end of the second major surface cleaning step or execute the coating film cleaning step in parallel with the second major surface cleaning step.

With the present apparatus, the second major surface is cleaned in the second major surface cleaning step. On the other hand, in the second major surface cleaning step, a cleaning liquid that landed on the second major surface may float around the substrate and become attached to the front surface of the coating film. The cleaning liquid that landed on the second major surface may also splash toward a member disposed around the substrate and be splashed back by the member and become attached to the front surface of the coating film. Further, the cleaning liquid that landed on the second major surface may also flow around to the first major surface side and become attached to the front surface of the coating film. The cleaning liquid that landed once on the second major surface may contain a contaminant, such as a particle, etc. A contaminant, such as a particle, etc., is even more likely to be contained in the cleaning liquid that is splashed back by a member included in the substrate processing apparatus.

With the present substrate processing apparatus, the coating film cleaning step is started after the end of the second major surface cleaning step or the coating film cleaning step is executed in parallel with the second major surface cleaning step. Therefore, even if the cleaning liquid attaches to the front surface of the coating film due to the second major surface cleaning step, the front surface of the coating film is cleaned in the coating film cleaning step. Contamination of the first major surface can thus be suppressed in the substrate processing apparatus in which the second major surface is cleaned by the second major surface cleaning step.

In the preferred embodiment of the present invention, the controller is programmed to execute, in the coating film cleaning step, a first cleaning step, in which cleaning of the coating film is started by the coating film cleaning unit after the end of the second major surface cleaning step. Here, a predetermined time is required for the cleaning liquid that landed on the second major surface to reach the front surface of the coating film and therefore after the end of the second major surface cleaning step, there is a possibility of the cleaning liquid becoming attached to the front surface of the coating film until the predetermined time elapses. With a configuration where the cleaning of the front surface of the coating film is started after the second major surface cleaning step as in the present substrate processing apparatus, the cleaning liquid attached to the front surface of the coating film due to the second major surface cleaning step can be removed reliably. Also, even if a contaminant is attached to the front surface of the coating film from before the start of the second major surface cleaning step, the contaminant can be removed at the same time as the cleaning liquid attached to the front surface of the coating film due to the second major surface cleaning step.

In the preferred embodiment of the present invention, the controller is programmed to execute, in the coating film cleaning step, a second cleaning step, in which the front surface of the coating film is cleaned by the coating film cleaning unit in parallel with the second major surface cleaning step.

The cleaning liquid attached to the front surface of the coating film due to the second major surface cleaning step can thus be removed immediately. If a contaminant is already attached to the front surface of the coating film before the start of the second major surface cleaning step, removal of the contaminant can be started before the cleaning liquid that landed on the second major surface reaches the front surface of the coating film. Further, time until the end of the coating film cleaning step can also be shortened. The number of substrates that can be processed per unit time can thus be increased. That is, improvement of throughput can be achieved, and contamination of the first major surface can thus be suppressed while achieving improvement of throughput.

As mentioned above, the predetermined time is required for the cleaning liquid that landed on the second major surface to reach the front surface of the coating film and therefore after the end of the second major surface cleaning step, there is a possibility of the cleaning liquid becoming attached to the front surface of the coating film until the predetermined time elapses. Thus, with the preferred embodiment of the present invention, the controller is programmed to end the second cleaning step after the end of the second major surface cleaning step. Attachment of contaminated cleaning liquid to the front surface of the coating film after the end of the coating film cleaning step can thus be suppressed further.

In the preferred embodiment of the present invention, the substrate processing apparatus further includes a protective liquid supplying unit which supplies a protective liquid, which protects the front surface of the coating film, to the first major surface. Also, the controller is programmed to execute a protective liquid supplying step of supplying the protective liquid from the protective liquid supplying unit to the front surface of the coating film in parallel with the second major surface cleaning step before the start of the coating film cleaning step. Attachment of contaminated cleaning liquid to the front surface of the coating film is thus suppressed by the protective liquid. Contamination of the first major surface can thus be suppressed.

In the preferred embodiment of the present invention, the coating film cleaning unit has a cleaning liquid supplying unit which supplies a cleaning liquid toward the first major surface. Also, the controller is programmed to execute, in the coating film cleaning step, a step of supplying the cleaning liquid from the cleaning liquid supplying unit toward the first major surface to clean the front surface of the coating film.

The cleaning liquid supplied to the front surface of the coating film in the coating film cleaning step thus spreads on the front surface of the coating film. A cleaning time of the front surface of the coating film can thus be reduced.

In the preferred embodiment of the present invention, the controller is programmed to execute, in the coating film cleaning step, a step of removing a surface layer of the coating film. Here, there may be a case where a particle becomes firmly attached to the front surface of the coating film, thus making it difficult to remove the particle from the front surface of the coating film. Even in such a case, the particle can be removed together with the surface layer of the coating film in the coating film cleaning step. The front surface of the coating film can thus be cleaned reliably.

In the preferred embodiment of the present invention, the substrate processing apparatus further includes a substrate heating unit which heats the substrate. Also, the controller is programmed to execute, in the coating film forming step, a solidifying step, in which the substrate is heated by the substrate heating unit, after the coating agent is supplied to the first major surface, to solidify the coating film. The coating film can thus be formed reliably.

Here, the coating agent supplied to the first major surface may flow around to the second major surface from a peripheral edge portion of the first major surface and become attached to a peripheral edge portion of the second major surface. In the preferred embodiment of the present invention, the substrate processing apparatus further includes a peripheral edge cleaning unit which cleans a peripheral edge of the second major surface. Also, the controller is programmed to execute a peripheral edge cleaning step, in which the peripheral edge of the second major surface is cleaned by the peripheral edge cleaning unit before the start of the solidifying step. Contamination of the second major surface by the coating agent can thus be suppressed.

In the preferred embodiment of the present invention, the substrate processing apparatus further includes a sublimating unit which sublimates the ccoating film. Also, the controller is programmed to execute a sublimating step, in which the coating film is sublimated by the sublimating unit, after the end of the coating film cleaning step. Therefore, the coating film is sublimated and the first major surface becomes exposed. The front surface of the coating film is cleaned in the coating film cleaning step and therefore a contaminant attached to the front surface of the coating film can be suppressed from remaining on the first major surface after sublimation of the coating film. That is, contamination of the first major surface is suppressed.

In the preferred embodiment of the present invention, a metal pattern is formed on the first major surface. Therefore, with the substrate processing apparatus of the configuration where the sublimating coating film is formed on the first major surface and the front surface of the coating film is cleaned, contamination of the first major surface can be suppressed while suppressing collapse of the metal pattern.

The aforementioned and yet other objects, features, and effects of the present invention will be made clear by the following description of the preferred embodiments with reference to the attached drawings.

BRIEF DESCRIPTION OF THE DRAWINGS

FIG. 8A to FIG. 8H are illustrative sectional views for describing the substrate processing.

FIG. 9A is a schematic sectional view of a vicinity of a first major surface of a substrate immediately before a coating film cleaning step is started in the substrate processing.

FIG. 9B is a schematic sectional view of the vicinity of the first major surface of the substrate immediately after the coating film cleaning step ends.

FIG. 10 is an illustrative sectional view for describing a second example of substrate processing by the substrate processing apparatus.

DETAILED DESCRIPTION OF THE PREFERRED EMBODIMENTS

First Preferred Embodiment

Figure 1A:
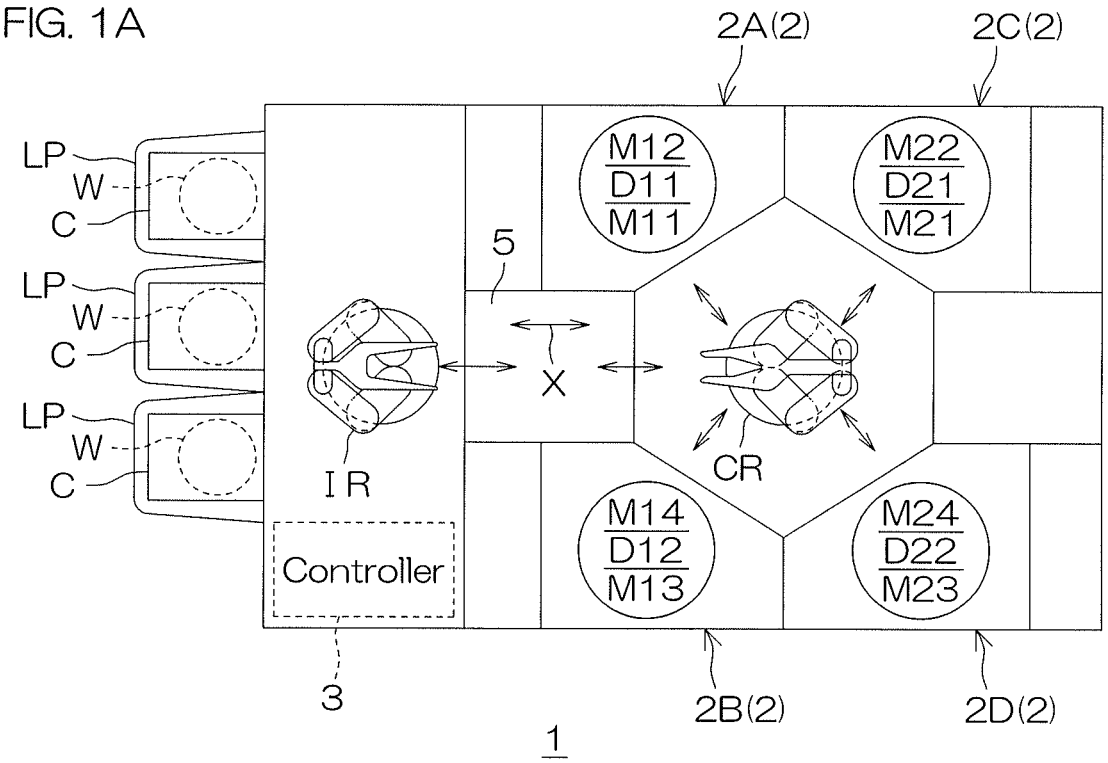
FIG. 1A is a plan view for describing a configuration of a substrate processing apparatus according to a first preferred embodiment of the present invention.
Figure 1B:
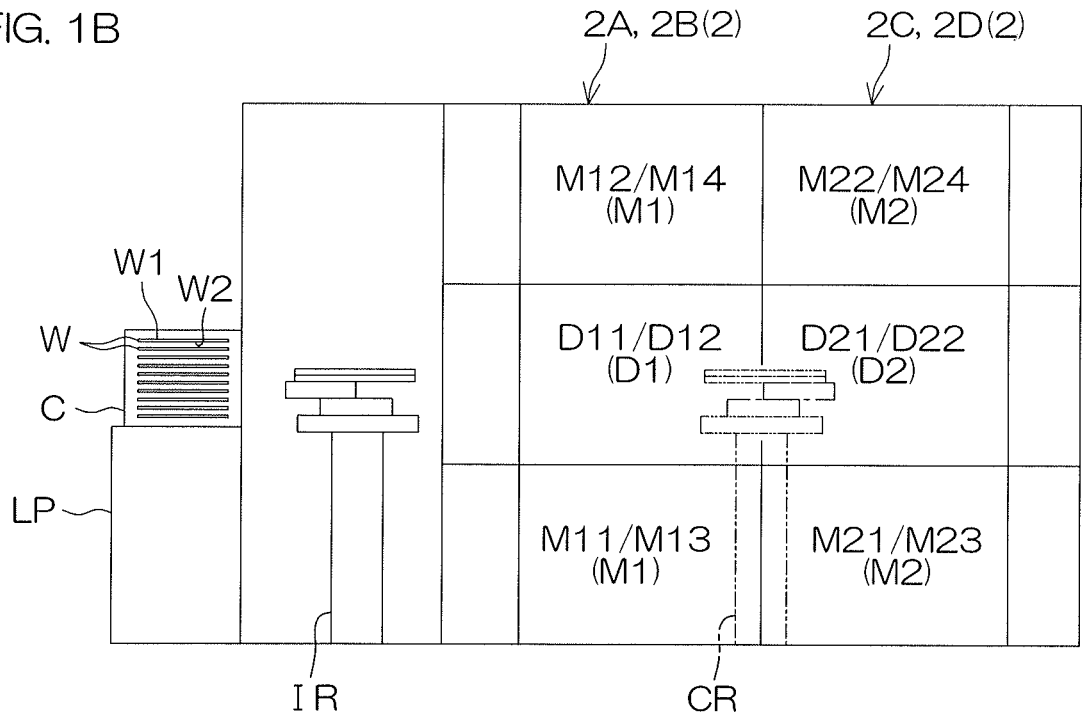
FIG. 1B is an illustrative elevation view for describing the configuration of the substrate processing apparatus.

FIG. 1A is a plan view for describing a configuration of a substrate processing apparatus 1 according to a first preferred embodiment of the present invention. FIG. 1B is an illustrative elevation view for describing the configuration of the substrate processing apparatus 1.

Referring to FIG. 1A, the substrate processing apparatus 1 is a single substrate processing type apparatus that applies various types of processing, such as a cleaning processing, an etching processing, etc., to substrates W, such as semiconductor wafers, etc., one by one. The substrate W processed by the substrate processing apparatus 1 is, for example, a substrate having a metal pattern formed on a major surface. In detail, the substrate W has a first major surface W1 and a second major surface W2, which is a major surface at an opposite side of the first major surface W1 (see FIG. 1B). A metal pattern is formed on the first major surface W1 and a metal pattern is not formed on the second major surface W2.

The substrate processing apparatus 1 includes a plurality (four in the present preferred embodiment) of processing towers 2A to 2D that process the substrates W with processing liquids, such as a chemical liquid, a rinse liquid, etc. The plurality of processing towers 2A to 2D are collectively referred to as the processing towers 2.

The substrate processing apparatus 1 further includes load ports LP, in each of which is placed a carrier C that houses a plurality of the substrates W to be processed by the processing towers 2, transfer robots IR and CR that transfers the substrates W between the load ports LP and the processing towers 2, and a controller 3 that controls the substrate processing apparatus 1.

The substrate processing apparatus 1 further includes a transfer passage 5 extending in a horizontal direction. The transfer passage 5 extends linearly from the transfer robot IR toward the transfer robot CR. The transfer robot IR transfers the substrates W between the carriers C and the transfer robot CR. The transfer robot CR transfers the substrates W between the transfer robot IR and the processing towers 2.

The plurality of processing towers 2 are disposed symmetrically across the transfer passage 5. The plurality of processing towers 2 are aligned along a direction (extension direction X) of extension of the transfer passage 5 at both sides respectively of the transfer passage 5. In the present preferred embodiment, two each of the processing towers 2 are disposed at each side of the transfer passage 5.

Of the plurality of processing towers 2A to 2D, the two processing towers 2 at a side closer to the transfer robot IR are respectively referred to as a first processing tower 2A and a second processing tower 2B. The first processing tower 2A and the second processing tower 2B face each other across the transfer passage 5. Of the plurality of processing towers 2A to 2D, the two processing towers 2 at a side further from the transfer robot IR are respectively referred to as a third processing tower 2C and a fourth processing tower 2D. The third processing tower 2C and the fourth processing tower 2D face each other across the transfer passage 5. The first processing tower 2A and the third processing tower 2C are disposed side by side along the extension direction X. The second processing tower 2B and the fourth processing tower 2D are disposed side by side along the extension direction X.

Each processing tower 2 includes a unit that processes a substrate W with processing liquids, a unit that heats the substrate W, etc. Although details shall be described below, a chemical liquid, a rinse liquid, a cleaning liquid, a covering agent, a removing liquid, etc., can be cited as the processing liquids.

Specifically, the first processing tower 2A includes first liquid processing units M11 and M12 and a first heating unit D11. The second processing tower 2B includes first liquid processing units M13 and M14 and a first heating unit D12. The third processing tower 2C includes second liquid processing units M21 and M22 and a second heating unit D21. The fourth processing tower 2D includes second liquid processing units M23 and M24 and a second heating unit D22.

The plurality of first liquid processing units M11 to M14 have, for example, the same configuration. The plurality of first liquid processing units M11 to M14 are referred to as the first liquid processing units M1 when referred to collectively. The plurality of first heating units D11 and D12 have, for example, the same configuration. The plurality of first heating units D11 and D12 are referred to as the first heating units D1 when referred to collectively. The plurality of second liquid processing units M21 to M24 have, for example, the same configuration. The plurality of second liquid processing units M21 to M24 are referred to as the second liquid processing units M2 when referred to collectively. The plurality of second heating units D21 and D22 have, for example, the same configuration. The plurality of second heating units D21 and D22 are referred to as the second heating units D2 when referred to collectively.

Referring to FIG. 1B, in the first processing tower 2A, the first liquid processing unit M11, the first heating unit D11, and the first liquid processing unit M12 are stacked up and down. In the first processing tower 2A, the first liquid processing unit M11 is disposed at a lowermost side and the first liquid processing unit M12 is disposed at an uppermost side. In the second processing tower 2B, the first liquid processing unit M13, the first heating unit D12, and the first liquid processing unit M14 are stacked up and down. In the second processing tower 2B, the first liquid processing unit M13 is disposed at a lowermost side and the first liquid processing unit M14 is disposed at an uppermost side.

In the third processing tower 2C, the second liquid processing unit M21, the second heating unit D21, and the second liquid processing unit M22 are stacked up and down. In the third processing tower 2C, the second liquid processing unit M21 is disposed at a lowermost side and the second liquid processing unit M22 is disposed at an uppermost side. In the fourth processing tower 2D, the second liquid processing unit M23, the second heating unit D22, and the second liquid processing unit M24 are stacked up and down. In the fourth processing tower 2D, the second liquid processing unit M23 is disposed at a lowermost side and the second liquid processing unit M24 is disposed at an uppermost side.

Figure 2:
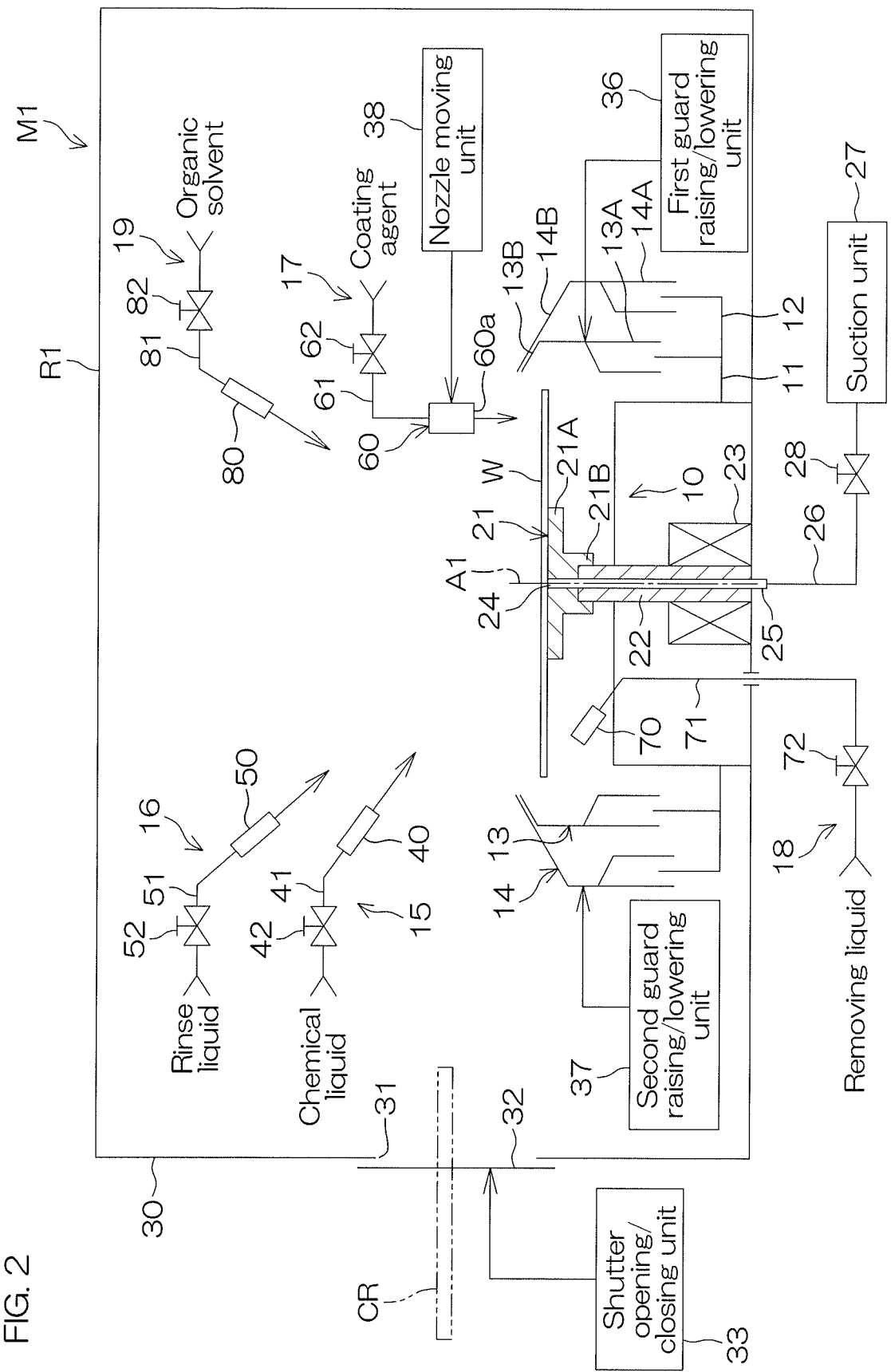
FIG. 2 is an illustrative sectional view for describing a configuration example of a first liquid processing unit included in the substrate processing apparatus.

FIG. 2 is an illustrative sectional view for describing a configuration example of a first liquid processing unit M1.

The first liquid processing unit M1 includes a chamber R1, a first spin chuck 10 which rotatably holds a substrate W horizontally, a plurality of cups 11 and 12 (a first cup 11 and a second cup 12) which surround the first spin chuck 10, and a plurality of guards 13 and 14 (a first guard 13 and a second guard 14) which receive a processing liquid eliminated from being on the substrate W to outside the substrate W. The first spin chuck 10, the plurality of cups 11 and 12, and the plurality of guards 13 and 14 are disposed inside the chamber R1.

The first liquid processing unit M1 further includes a chemical liquid supplying unit 15, a first rinse liquid supplying unit 16, a covering agent supplying unit 17, a removing liquid supplying unit 18, and an organic solvent supplying unit 19.

The chemical liquid supplying unit 15 is a unit that supplies a chemical liquid, such as hydrofluoric acid, etc., to an upper surface of the substrate W. The first rinse liquid supplying unit 16 is a unit that supplies a rinse liquid, such as deionized water (DIW), etc., to the upper surface of the substrate W. The coating (covering) agent supplying unit 17 is a unit that supplies a coating (covering) agent to the upper surface of the substrate W. The removing liquid supplying unit 18 is a unit that supplies a removing liquid, for removing the coating agent attached to the substrate W, to a peripheral edge of a lower surface of the substrate W. The organic solvent supplying unit 19 is a unit that supplies an organic solvent, such as isopropyl alcohol (IPA), etc., to the upper surface of the substrate W.

The first spin chuck 10 includes a spin base 21, a rotating shaft 22, and an electric motor 23 applying a rotating force to the rotating shaft 22. The rotating shaft 22 is a hollow shaft. The rotating shaft 22 extends in a vertical direction along a rotational axis A1. The spin base 21 is coupled to an upper end of the rotating shaft 22. The spin base 21 has a disk-shaped disk portion 21A which is oriented along the horizontal direction, and a cylindrical portion 21B which is externally fitted to the upper end of the rotating shaft 22. A diameter of an upper surface of the disk portion 21A is smaller than a diameter of the substrate W.

The first spin chuck 10 further includes a suction unit 27 that suctions the substrate W disposed on an upper surface of the spin base 21 to make the substrate W be held by the spin base 21. A suction path 25 passes through the spin base 21 and the rotating shaft 22. The suction path 25 includes a suction port 24 exposed from a center of the upper surface of the spin base 21. The suction path 25 is joined to a suction pipe 26. The suction pipe 26 is joined to a suction unit 27, such as a vacuum pump, etc. The suction pipe 26 has interposed therein a suction valve 28 arranged to open and close its path. The first spin chuck 10 is an example of a substrate holding unit which is arranged to horizontally hold the substrate W.

The electric motor 23 applies the rotating force to the rotating shaft 22. The spin base 21 is rotated by the rotating shaft 22 being rotated by the electric motor 23. The substrate W is thereby rotated around the rotational axis A1. In the following description, an inner side in a rotational radius direction of the substrate W shall be referred to simply as the "radially inner side" and an outer side in the rotational radius direction of the substrate W shall be referred to simply as the "radially outer side." The electric motor 23 is an example of a rotating unit that rotates the substrate W around the rotational axis A1.

An inlet/outlet 31, through which the substrate W is carried in and out by the transfer robot CR, is formed in a side wall 30 of the chamber R1. The chamber R1 is provided with a shutter 32 that opens and closes the inlet/outlet 31. The shutter 32 is driven to open and close by a shutter opening/closing unit 33.

Each of the cups 11 and 12 has an upwardly-open annular groove. Each of the cups 11 and 12 surrounds the first spin chuck 10. The second cup 12 is disposed further to the radially outer side than the first cup 11. A recovery piping (not shown) or a drain piping (not shown) is connected to the groove of each of the cups 11 and 12.

The guards 13 and 14 are disposed so as to surround the first spin chuck 10 in plan view. The second guard 14 is disposed further to the radially outer side than the first guard 13. The first guard 13 includes a first cylindrical portion 13A, surrounding the first spin chuck 10 at a position higher than the first cup 11, and a first extension portion 13B, extending from the first cylindrical portion 13A so as to rise upward toward the radially inner side. The second guard 14 includes a second cylindrical portion 14A, surrounding the first spin chuck 10 at a position higher than the second cup 12, and a second extension portion 14B, extending from the second cylindrical portion 14A such as to rise upward toward the radially inner side.

A processing liquid eliminated from the substrate W is received by the guards 13 and 14. The processing liquid received by the first guard 13 is guided along the first cylindrical portion 13A to the first cup 11. The processing liquid received by the second guard 14 is guided along the second cylindrical portion 14A to the second cup 12. The processing liquid guided to a bottom portion of each of the cups 11 and 12 is recovered or discarded through the recovery piping or the drain piping.

The first guard 13 is raised and lowered between an upper position and a lower position by a first guard raising/lowering unit 36. The second guard 14 is raised and lowered between an upper position and a lower position by a second guard raising/lowering unit 37. When the first guard 13 is positioned at the upper position, an upper end of the first guard 13 is positioned higher than the substrate W. When the first guard 13 is positioned at the lower position, the upper end of the first guard 13 is positioned lower than the substrate W. When the second guard 14 is positioned at the upper position, an upper end of the second guard 14 is positioned higher than the substrate W. When the second guard 14 is positioned at the lower position, the upper end of the second guard 14 is positioned lower than the substrate W.

The first extension portion 13B of the first guard 13 faces the second extension portion 14B of the second guard 14 from below. Therefore, the second guard 14 cannot move lower than the first guard 13. Therefore, when the first guard 13 is positioned at the upper position, the second guard 14 cannot be positioned at the lower position. When both the first guard 13 and the second guard 14 are positioned at the upper positions, the processing liquid eliminated from the substrate W is received by the first guard 13. When the first guard 13 is positioned at the lower position and the second guard 14 is positioned at the upper position, the processing liquid eliminated from the substrate W is received by the second guard 14. When both the first guard 13 and the second guard 14 are positioned at the lower positions, the transfer robot CR can access the spin base 21.

The chemical liquid supplying unit 15 includes a chemical liquid nozzle 40, discharging the chemical liquid toward the upper surface of the substrate W, a chemical liquid supplying pipe 41, coupled to the chemical liquid nozzle 40, and a chemical liquid valve 42, interposed in the chemical liquid supplying pipe 41. The chemical liquid, such as hydrofluoric acid (hydrogen fluoride solution: HF), etc., is supplied from a chemical liquid supplying source to the chemical liquid supplying pipe 41. The chemical liquid valve 42 opens and closes a flow passage inside the chemical liquid supplying pipe 41. In the present preferred embodiment, the chemical liquid nozzle 40 is a fixed nozzle that is fixed in positions in the horizontal direction and the vertical direction.

The chemical liquid discharged from the chemical liquid nozzle 40 is a liquid used in etching, etc., of the substrate W. The chemical liquid discharged from the chemical liquid nozzle 40 is not restricted to hydrofluoric acid. The chemical liquid discharged from the chemical liquid nozzle 40 may be a liquid containing at least one of sulfuric acid, acetic acid, nitric acid, hydrochloric acid, hydrofluoric acid, buffered hydrofluoric acid (BHF), dilute hydrofluoric acid (DHF), ammonia water, hydrogen peroxide water, an organic acid (for example, citric acid, oxalic acid, etc.), an organic alkali (for example, TMAH: tetramethylammonium hydroxide, etc.), a surfactant, and a corrosion inhibitor. As examples of a chemical liquid in which the above are mixed, SPM (sulfuric acid-hydrogen peroxide mixture), SC1 (ammonia-hydrogen peroxide mixture), SC2 (hydrochloric acid-hydrogen peroxide mixture), etc., can be cited.

The first rinse liquid supplying unit 16 includes a first rinse liquid nozzle 50, discharging the rinse liquid toward the upper surface of the substrate W, a first rinse liquid supplying pipe 51, coupled to the first rinse liquid nozzle 50, and a first rinse liquid valve 52, interposed in the first rinse liquid supplying pipe 51. The rinse liquid, such as DIW, etc., is supplied from a first rinse liquid supplying source to the first rinse liquid supplying pipe 51. The first rinse liquid valve 52 opens and closes a flow passage inside the first rinse liquid supplying pipe 51. In the present preferred embodiment, the first rinse liquid nozzle 50 is a fixed nozzle that is fixed in positions in the horizontal direction and the vertical direction.

The rinse liquid is a liquid for washing away the chemical liquid, etc., attached to the substrate W. The rinse liquid discharged from the first rinse liquid nozzle 50 is not restricted to DIW. The rinse liquid discharged from the first rinse liquid nozzle 50 may be carbonated water, electrolyzed ion water, ozone water, ammonia water, aqueous hydrochloric acid solution of dilute concentration (of, for example, approximately 10 ppm to 100 ppm), or reduced water (hydrogen water).

The coating agent supplying unit 17 includes a coating agent nozzle 60, discharging the coating agent toward the upper surface of the substrate W, a coating agent supplying pipe 61, coupled to the coating agent nozzle 60, and a coating agent valve 62, interposed in the coating agent supplying pipe 61. The coating agent is supplied from a coating agent supplying source to the coating agent supplying pipe 61. The coating agent valve 62 opens and closes a flow passage inside the coating agent supplying pipe 61.

The coating agent discharged from the coating agent nozzle 60 is a liquid that can form a sublimating coating (covering) film. The coating agent is, for example, a solution in which a sublimating acrylic-based polymer is dissolved in an organic solvent. PGEE (1-ethoxy-2-propanol), etc., can be cited as the organic solvent that dissolves the sublimating acrylic-based polymer. In the present preferred embodiment, the coating agent is heated to 250° C. to evaporate the organic solvent and form the coating film. Also, the coating film is sublimated by being heated to 300° C.

The coating agent nozzle 60 is moved in the vertical direction and the horizontal direction by a coating agent nozzle moving unit 38. By movement in the horizontal direction, the coating agent nozzle 60 is moved between a central position and a retreat position. When the coating agent nozzle 60 is positioned at the central position, a discharge port 60a, provided in the coating agent nozzle 60, faces a rotation center position of the upper surface of the substrate W from the vertical direction. When the coating agent nozzle 60 is positioned at the retreat position, the discharge port 60a does not face the upper surface of the substrate W from the vertical direction. The rotation center position of the upper surface of the substrate W is an intersection position of the upper surface of the substrate W with the rotational axis A1.

The removing liquid supplying unit 18 includes a removing liquid nozzle 70, discharging the removing liquid toward a peripheral edge portion of the lower surface of the substrate W, a removing liquid supplying pipe 71, coupled to the removing liquid nozzle 70, and a removing liquid valve 72, interposed in the removing liquid supplying pipe 71. The removing liquid, such as TMAH, etc., is supplied from a removing liquid supplying source to the removing liquid supplying pipe 71. The removing liquid valve 72 opens and closes a flow passage inside the removing liquid supplying pipe 71.

The removing liquid discharged from the removing liquid nozzle 70 is, for example, IPA. The removing liquid discharged from the removing liquid nozzle 70 is not restricted to IPA. The removing liquid discharged from the removing liquid nozzle 70 may be a liquid having an alkaline property, such as TMAH. The removing liquid discharged from the removing liquid nozzle 70 is not restricted to TMAH. The removing liquid may, for example, be ammonia water or choline aqueous solution. The removing liquid may be a mixed liquid of TMAH, ammonia water, choline aqueous solution, etc.

The organic solvent supplying unit 19 includes an organic solvent nozzle 80, discharging the organic solvent toward the upper surface of the substrate W, an organic solvent supplying pipe 81, coupled to the organic solvent nozzle 80, and an organic solvent valve 82, interposed in the organic solvent supplying pipe 81. The organic solvent, such as IPA, etc., is supplied from an organic solvent supplying source to the organic solvent supplying pipe 81. The organic solvent valve 82 opens and closes a flow passage inside the organic solvent supplying pipe 81.

The organic solvent discharged from the organic solvent nozzle 80 is not restricted to IPA. The organic solvent discharged from the organic solvent nozzle 80 suffices to be miscible with both the solvent contained in the coating agent and the water contained in the rinse liquid.

Figure 3:
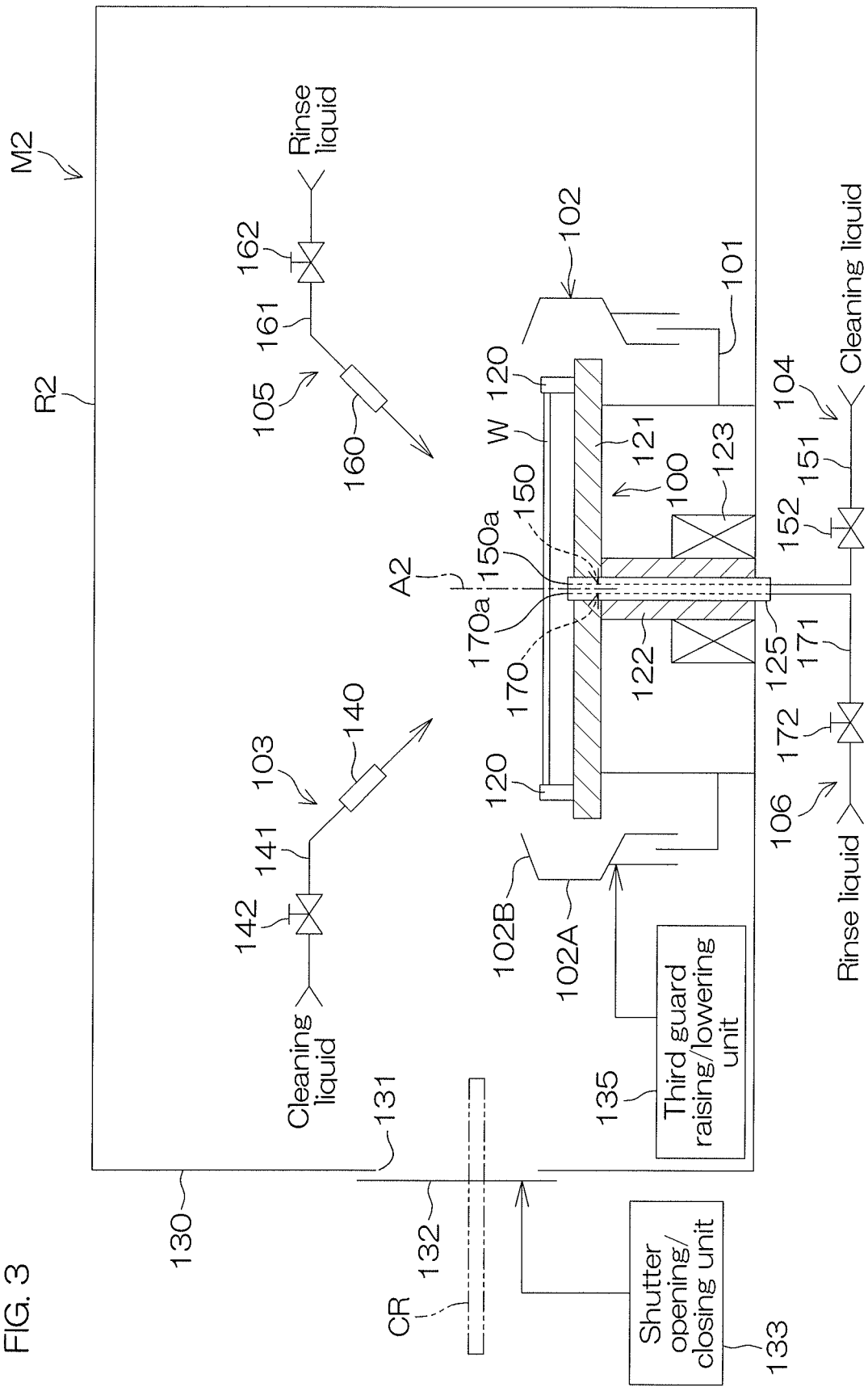
FIG. 3 is an illustrative sectional view for describing a configuration example of a second liquid processing unit included in the substrate processing apparatus.

FIG. 3 is an illustrative sectional view for describing a configuration example of a second liquid processing unit M2.

The second liquid processing unit M2 includes a chamber R2, a second spin chuck 100, rotatably holding a substrate W horizontally, a third cup 101, surrounding the second spin chuck 100, and a third guard 102, receiving a processing liquid eliminated from being on the substrate W to outside the substrate W. The second spin chuck 100, the third cup 101, and the third guard 102 are disposed inside the chamber R2.

The second liquid processing unit M2 further includes a first cleaning liquid supplying unit 103, a second cleaning liquid supplying unit 104, a second rinse liquid supplying unit 105, and a third rinse liquid supplying unit 106. The first cleaning liquid supplying unit 103 supplies a cleaning liquid to the upper surface of the substrate W. The second cleaning liquid supplying unit 104 supplies a cleaning liquid to the lower surface of the substrate W. The second rinse liquid supplying unit 105 supplies a rinse liquid, such as deionized water (DIW), etc., to the upper surface of the substrate W. The third rinse liquid supplying unit 106 supplies a rinse liquid, such as deionized water (DIW), etc., to the lower surface of the substrate W.

The second spin chuck 100 holds the single substrate W in a horizontal orientation and meanwhile rotates the substrate W around a vertical rotational axis A2 passing through a central portion of the substrate W. The second spin chuck 100 includes a spin base 121, a plurality of chuck pins 120, a rotating shaft 122, and an electric motor 123.

The spin base 121 has a disk shape oriented along the horizontal direction. On an upper surface of the spin base 121, the plurality of chuck pins 120 are disposed at intervals in a circumferential direction. When clamped by the plurality of chuck pins 120, the substrate W is separated upward from the upper surface of the spin base 121. The rotating shaft 122 is coupled to a lower surface center of the spin base 21. The rotating shaft 122 is a hollow shaft. The rotating shaft 122 extends in the vertical direction along the rotational axis A2. The electric motor 123 applies a rotating force to the rotating shaft 122. The spin base 121 is rotated by the rotating shaft 122 being rotated by the electric motor 123. The substrate W is thereby rotated around the rotational axis A2. The electric motor 123 is included in a rotating unit that rotates the substrate W around the rotational axis A2.

An inlet/outlet 131, through which the substrate W is carried in and out by the transfer robot CR, is formed in a side wall 130 of the chamber R2. The chamber R2 is provided with a shutter 132 that opens and closes the inlet/outlet 131. The shutter 132 is driven to open and close by a shutter opening/closing unit 133.

The third cup 101 has an upwardly-open annular groove. The third cup 101 surrounds the second spin chuck 100. A recovery piping (not shown) or a drain piping (not shown) is connected to the groove of the third cup 101. The third guard 102 is disposed so as to surround the second spin chuck 100 in plan view.

The third guard 102 includes a third cylindrical portion 102A, surrounding the second spin chuck 100 at a position higher than the third cup 101, and a third extension portion 102B, extending from the third cylindrical portion 102A so as to rise upward toward the radially inner side.

A processing liquid eliminated from the substrate W is guided along the third cylindrical portion 102A to the third cup 101. The processing liquid guided to a bottom portion of the third cup 101 is recovered or discarded through the recovery piping or the drain piping.

The third guard 102 is raised and lowered between an upper position and a lower position by a third guard raising/lowering unit 136. When the third guard 102 is positioned at the upper position, an upper end of the third guard 102 is positioned higher than the substrate W. When the third guard 102 is positioned at the lower position, the upper end of the third guard 102 is positioned lower than the substrate W. When the third guard 102 is positioned at the upper position, the processing liquid eliminated from the substrate W is received by the third guard 102. When the third guard 102 is positioned at the lower position, the transfer robot CR can access the spin base 121.

The first cleaning liquid supplying unit 103 includes a first cleaning liquid nozzle 140, discharging the cleaning liquid toward the upper surface of the substrate W, a first cleaning liquid supplying pipe 141, coupled to the first cleaning liquid nozzle 140, and a first cleaning liquid valve 142, interposed in the first cleaning liquid supplying pipe 141. The cleaning liquid, such as SC1, etc., is supplied from a first cleaning liquid supplying source to the first cleaning liquid supplying pipe 141. In the present preferred embodiment, the first cleaning liquid nozzle 140 is a fixed nozzle that is fixed in positions in the horizontal direction and the vertical direction.

The second cleaning liquid supplying unit 104 includes a second cleaning liquid nozzle 150, discharging the cleaning liquid toward the lower surface of the substrate W, a second cleaning liquid supplying pipe 151, coupled to the second cleaning liquid nozzle 150, and a second cleaning liquid valve 152, interposed in the second cleaning liquid supplying pipe 151. The cleaning liquid, such as SC1, etc., is supplied from a second cleaning liquid supplying source to the second cleaning liquid supplying pipe 151. The second cleaning liquid nozzle 150 is passed through a nozzle housing portion 125 that is passed through the rotating shaft 122. The nozzle housing portion 125 faces a central region of the lower surface of the substrate W from below. A discharge port 150a of the second cleaning liquid nozzle 150 is exposed from a tip of the nozzle housing portion 125.

The cleaning liquid discharged from the first cleaning liquid nozzle 140 and the cleaning liquid discharged from the second cleaning liquid nozzle 150 are not restricted to SC1. The cleaning liquid discharged from the first cleaning liquid nozzle 140 and the cleaning liquid discharged from the second cleaning liquid nozzle 150 may be an ammonia-containing liquid other than SC1. The cleaning liquid discharged from the first cleaning liquid nozzle 140 and the cleaning liquid discharged from the second cleaning liquid nozzle 150 may be an organic solvent, such as IPA, etc.

The second rinse liquid supplying unit 105 includes a second rinse liquid nozzle 160, discharging the rinse liquid toward the upper surface of the substrate W, a second rinse liquid supplying pipe 161, coupled to the second rinse liquid nozzle 160, and a second rinse liquid valve 162, interposed in the second rinse liquid supplying pipe 161. The rinse liquid, such as DIW, etc., is supplied from a second rinse liquid supplying source to the second rinse liquid supplying pipe 161. In the present preferred embodiment, the second rinse liquid nozzle 160 is a fixed nozzle that is fixed in positions in the horizontal direction and the vertical direction.

The third rinse liquid supplying unit 106 includes a third rinse liquid nozzle 170, discharging the rinse liquid toward the lower surface of the substrate W, a third rinse liquid supplying pipe 171, coupled to the third rinse liquid nozzle 170, and a third rinse liquid valve 172, interposed in the third rinse liquid supplying pipe 171. The rinse liquid, such as DIW, etc., is supplied from a third rinse liquid supplying source to the third rinse liquid supplying pipe 171. The third rinse liquid nozzle 170 is passed, together with the second cleaning liquid nozzle 150, through the nozzle housing portion 125. A discharge port 170a of the third rinse liquid nozzle 170 is exposed from a tip of the nozzle housing portion 125.

The rinse liquid discharged from the second rinse liquid nozzle 160 and the rinse liquid discharged from the third rinse liquid nozzle 170 are not restricted to DIW. The rinse liquid discharged from the second rinse liquid nozzle 160 and the rinse liquid discharged from the third rinse liquid nozzle 170 may be carbonated water, electrolyzed ion water, ozone water, ammonia water, aqueous hydrochloric acid solution of dilute concentration (of, for example, approximately 10 ppm to 100 ppm), or reduced water (hydrogen water).

Figure 4:
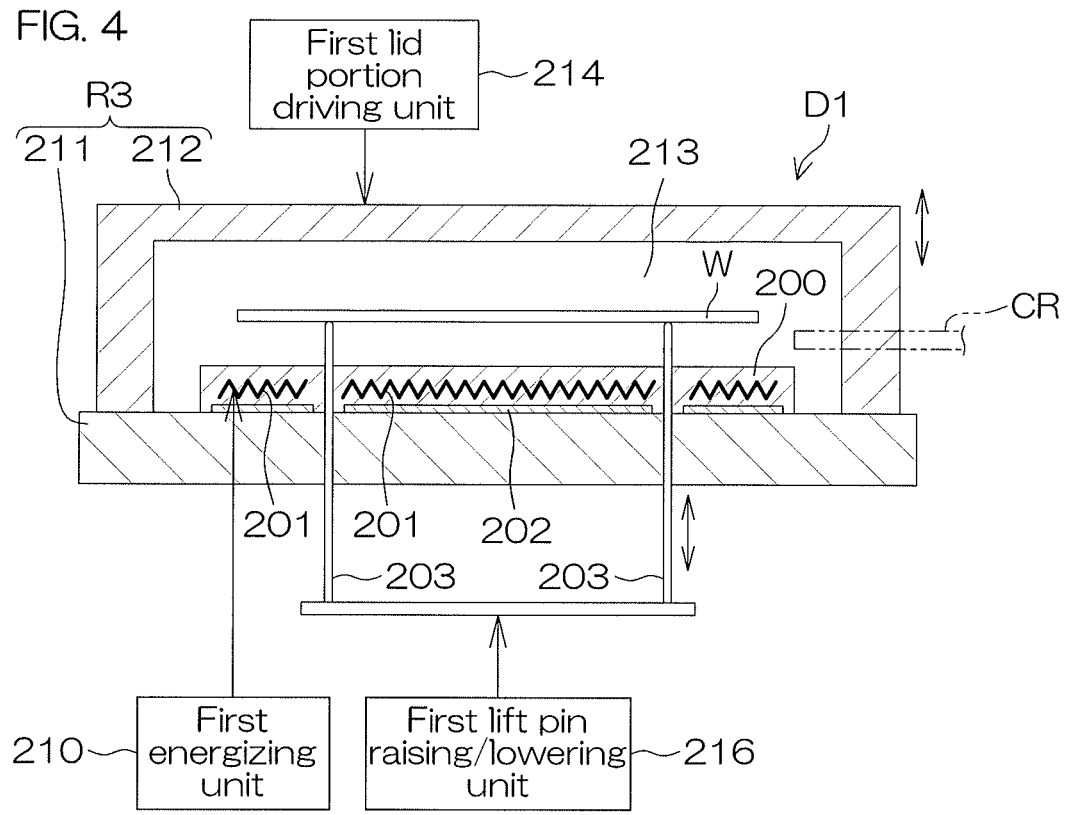
FIG. 4 is an illustrative sectional view for describing a configuration example of a first heating unit included in the substrate processing apparatus.

FIG. 4 is an illustrative sectional view for describing a configuration example of a first heating unit D1. The first heating unit D1 includes a chamber R3, a first substrate holder 200, holding a substrate W, a first heater 201 (substrate heating unit), heating the substrate W, a first cooling unit 202, cooling the substrate W, and a plurality of first lift pins 203, moving the substrate W up and down.

The first substrate holder 200 is a plate-shaped member supporting the substrate W from below such that the substrate W is put in a horizontal orientation. The first substrate holder 200 is included in a substrate holding unit that holds the substrate W horizontally. The first substrate holder 200 is housed inside the chamber R3.

The first heater 201 and the first cooling unit 202 are incorporated in the first substrate holder 200. A temperature adjusting plate is configured by the first heater 201, the first cooling unit 202, and the first substrate holder 200. The first heater 201 heats the substrate W by heat transfer or heat radiation. A first heater energizing unit 210, supplying power to the first heater 201, is connected to the first heater 201. The first heater 201 is capable of heating the substrate W to approximately 250° C.

An electromagnetic wave irradiating unit that irradiates an electromagnetic wave (ultraviolet ray, infrared ray, microwave, X-ray, laser light, etc.) to heat the substrate W may be used in place of the first heater 201. The first cooling unit 202 may have a cooling passage passing inside the first substrate holder 200. The first cooling unit 202 may have an electronic cooling element.

The plurality of first lift pins 203 are respectively inserted in a plurality of penetrating holes penetrating through the first substrate holder 200. The plurality of first lift pins 203 are raised and lowered between an upper position and a lower position by a first lift pin raising/lowering unit 216. When the plurality of first lift pins 203 are positioned at the upper position, the substrate W is separated upward from the first substrate holder 200. When the plurality of first lift pins 203 are positioned at the lower position, upper end portions of the plurality of first lift pins 203 are retreated in an interior of the first substrate holder 200. The substrate W is thus supported from below by the first substrate holder 200.

The chamber R3 has a first base portion 211 and a first movable lid portion 212, moving up and down with respect to the first base portion 211. An internal space 213 of the chamber R3 is defined by the first base portion 211 and the first movable lid portion 212. The first movable lid portion 212 is raised and lowered between an upper position and a lower position by a first lid portion driving unit 214. When the first movable lid portion 212 is positioned at the lower position, the first base portion 211 and the first movable lid portion 212 are in contact. The chamber R3 is thereby closed. When the first movable lid portion 212 is positioned at the upper position, the transfer robot CR can access the internal space 213 of the chamber R3.

Figure 5:
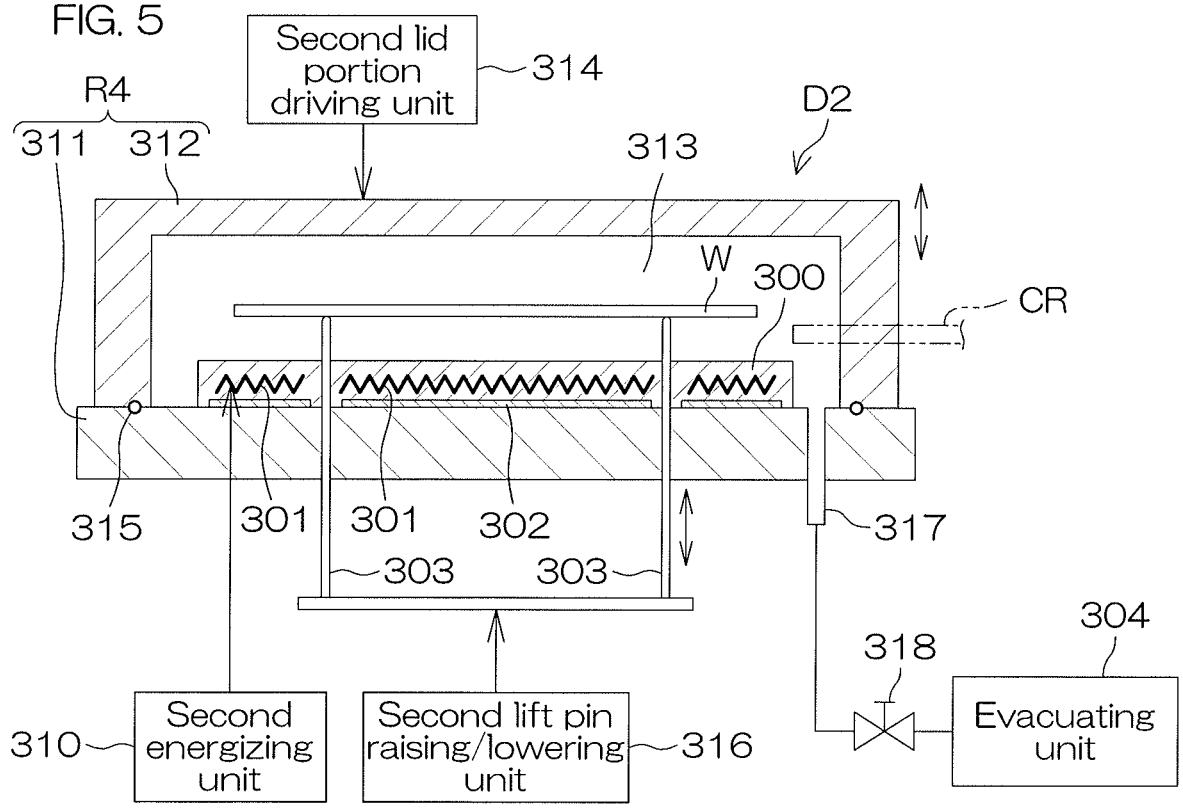
FIG. 5 is an illustrative sectional view for describing a configuration example of a second heating unit included in the substrate processing apparatus.

FIG. 5 is an illustrative sectional view for describing a configuration example of a second heating unit D2.

The second heating unit D2 includes a sealable chamber R4, a second substrate holder 300, holding a substrate W, a second heater 301, heating the substrate W, a second cooling unit 302, cooling the substrate W, a plurality of second lift pins 303, moving the substrate W up and down, and an evacuating unit 304, evacuating the chamber R4.

The second substrate holder 300 is a plate-shaped member supporting the substrate W from below such that the substrate W is put in a horizontal orientation. The second substrate holder 300 is included in the substrate holding unit that holds the substrate W horizontally. The second substrate holder 300 is housed inside the chamber R4.

The second heater 301 and the second cooling unit 302 are incorporated in the second substrate holder 300. A temperature adjusting plate is configured by the second heater 301, the second cooling unit 302, and the second substrate holder 300. The second heater 301 heats the substrate W by heat transfer or heat radiation. A second heater energizing unit 310, supplying power to the second heater 301, is connected to the second heater 301. The second heater 301 suffices to be configured so as to be capable of heating the substrate W to a higher temperature than the first heater 201 (see FIG. 4). The second heater 301 suffices to be configured so as to be capable of heating the substrate W, for example, to approximately 300° C.

An electromagnetic wave irradiating unit that irradiates an electromagnetic wave (ultraviolet ray, infrared ray, microwave, X-ray, laser light, etc.) to heat the substrate W may be used in place of the second heater 301. The second cooling unit 302 may have a cooling passage passing inside the second substrate holder 300. The second cooling unit 302 may have an electronic cooling element.

The plurality of second lift pins 303 are respectively inserted in a plurality of penetrating holes penetrating through the second substrate holder 300. The plurality of second lift pins 303 are raised and lowered between an upper position and a lower position by a second lift pin raising/lowering unit 316. When the plurality of second lift pins 303 are positioned at the upper position, the substrate W is separated upward from the second substrate holder 300. When the plurality of second lift pins 303 are positioned at the lower position, upper end portions of the plurality of second lift pins 303 are retreated in an interior of the second substrate holder 300. The substrate W is thus supported from below by the second substrate holder 300.

The chamber R4 has a second base portion 311 and a second movable lid portion 312, moving up and down with respect to the second base portion 311. An internal space 313 of the chamber R4 is defined by the second base portion 311 and the second movable lid portion 312. The second movable lid portion 312 is raised and lowered between an upper position and a lower position by a second lid portion driving unit 314. When the second movable lid portion 312 is positioned at the lower position, the second base portion 311 and the second movable lid portion 312 are in contact. When the second movable lid portion 312 is positioned at the lower position, an interval between the second base portion 311 and the second movable lid portion 312 is sealed by an O-ring 315. When the second movable lid portion 312 is positioned at the upper position, the transfer robot CR can access the internal space 313 of the chamber R4.

An exhaust pipe 317, guiding gas inside the internal space 313 to outside the chamber R4, is connected to the second base portion 311. An exhaust valve 318, opening and closing a flow passage inside the exhaust pipe 317, is interposed in the exhaust pipe 317. The exhaust pipe 317 is connected to the evacuating unit 304. The evacuating unit 304 is, for example, a vacuum pump.

Figure 6:
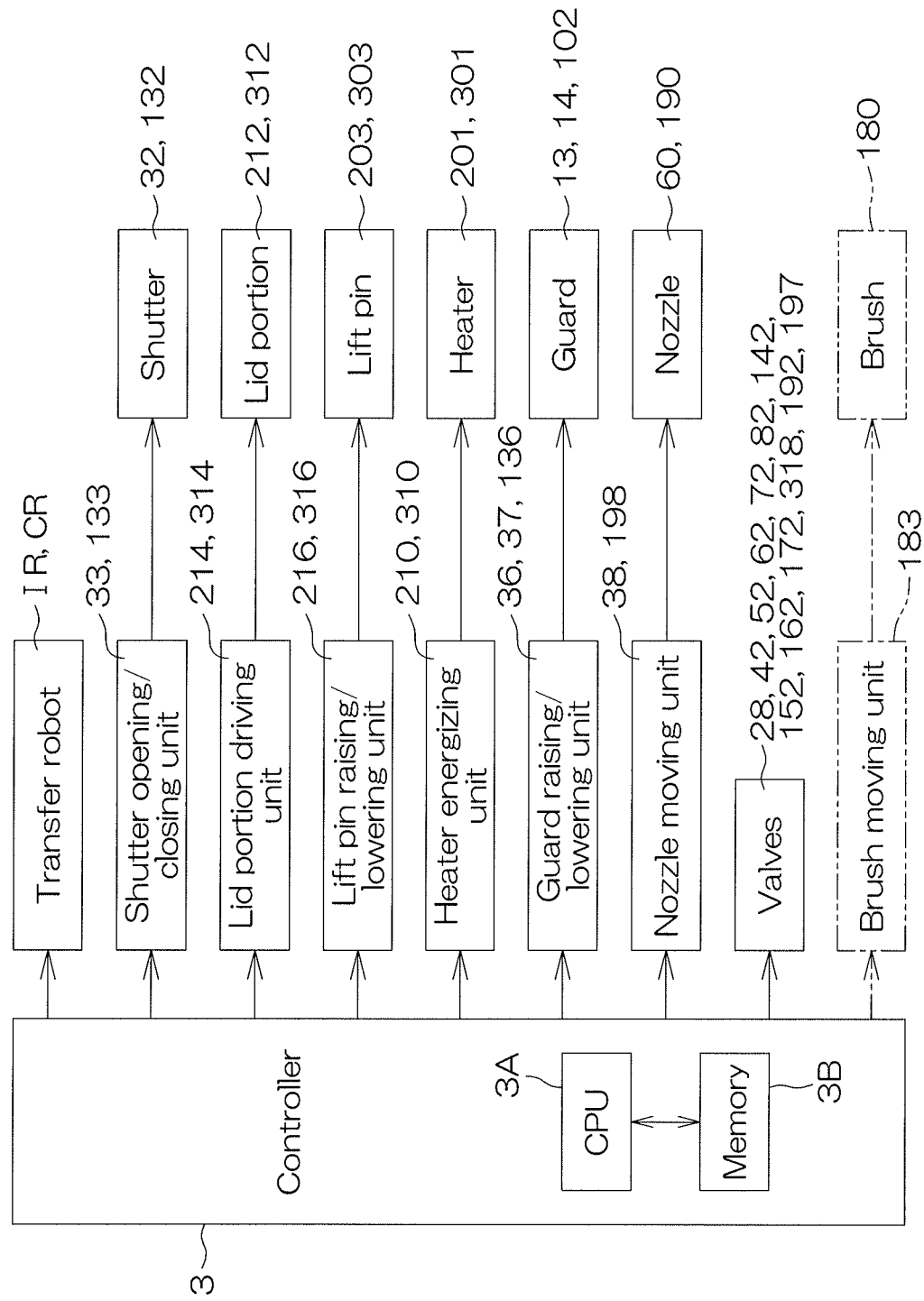
FIG. 6 is a block diagram for describing an electrical configuration of a main portion of the substrate processing apparatus.

FIG. 6 is a block diagram for describing an electrical configuration of a main portion of the substrate processing apparatus 1. The controller 3 includes a microcomputer and controls control objects, included in the substrate processing apparatus 1, in accordance with a predetermined program. More specifically, the controller 3 includes a processor (CPU) 3A and a memory 3B, storing the program. The controller 3 is arranged to execute various controls for substrate processing by the processor 3A executing the program. In particular, the controller 3 controls operations of the transfer robots IR and CR, the shutter opening/closing units 33 and 133, the lid portion driving units 214 and 314, the lift pin raising/lowering units 216 and 316, the heater energizing units 210 and 310, the guard raising/lowering units 36, 37, and 136, the nozzle moving unit 38, and the valves 28, 42, 52, 62, 72, 82, 142, 152, 162, 172, and 318, etc.

Figure 7:
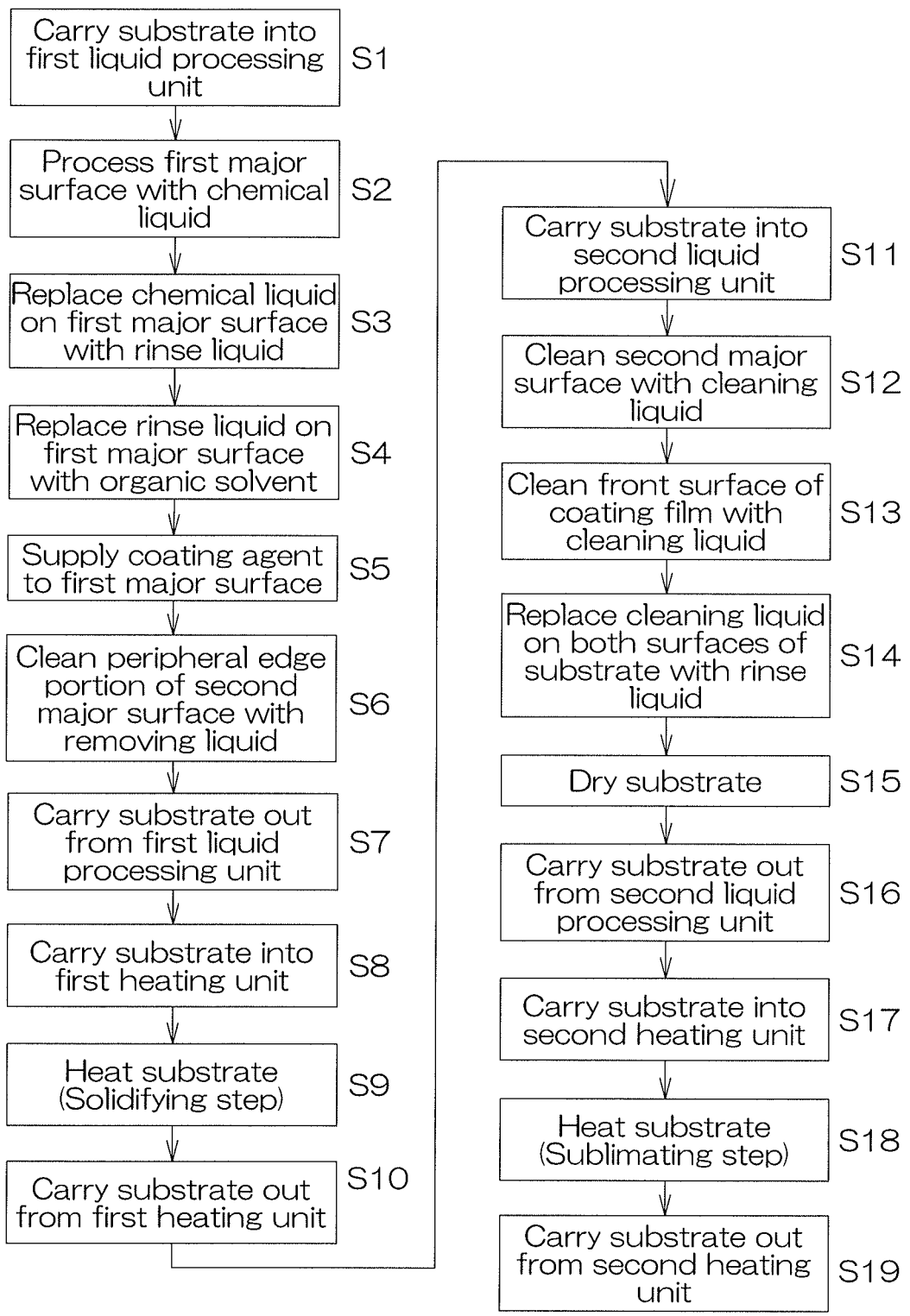
FIG. 7 is a flowchart for describing a first example of substrate processing by the substrate processing apparatus.

FIG. 7 is a flowchart for describing a first example of substrate processing by the substrate processing apparatus 1 and mainly shows processing realized by the controller 3 executing the program. FIG. 8A to FIG. 8H are illustrative sectional views for describing the first example of substrate processing.

In the substrate processing by the substrate processing apparatus 1, a substrate W is processed continuously. During the continuous processing of the substrate W, the first heater 201 of a first heating unit D1 is maintained in a state of being energized by the first heater energizing unit 210 (see FIG. 4). Similarly, during the continuous processing of the substrate W, the second heater 301 of a second heating unit D2 is maintained in a state of being energized by the second heater energizing unit 310 (see FIG. 5).

Referring also to FIG. 1A, firstly in the substrate processing by the substrate processing apparatus 1, the substrate W is carried from a carrier C into a first liquid processing unit M1 by the transfer robots IR and CR (step S1: first carrying-in step). Referring also to FIG. 2, the transfer robot CR can enter into the first liquid processing unit M1 via the inlet/outlet 31. The substrate W carried into the first liquid processing unit M1 is passed onto the first spin chuck 10 from the transfer robot CR. The substrate W is placed on the spin chuck 21 such that the first major surface W1 is the upper surface.

The suction valve 28 is then opened. The substrate W is thereby held by the first spin chuck 10 in a state where the second major surface W2 of the substrate W contacts the upper surface of the spin base 21 (first substrate holding step). Thereafter, the substrate W is maintained in a horizontally-held state until the substrate W is carried out from the first liquid processing unit M1 by the transfer robot CR.

The electric motor 23 then starts rotation of the substrate W (substrate rotating step). The guard raising/lowering units 36 and 37 then disposes the guards 13 and 14 at the upper positions. The chemical liquid valve 42 is then opened. Supplying of the chemical liquid from the chemical liquid nozzle 40 of the chemical liquid supplying unit 15 to the first major surface W1 of the substrate W is thereby started (chemical liquid supplying step). The chemical liquid supplied to the first major surface W1 spreads across an entirety of the first major surface W1 due to a centrifugal force. The substrate W is thereby processed by the chemical liquid (step S2: chemical liquid processing step). The chemical liquid eliminated outside the substrate W by the centrifugal force is received by the first guard 13.

After the chemical liquid is supplied to the first major surface W1 for a fixed time, the chemical liquid valve 42 is closed and the first rinse liquid valve 52 is opened. Supplying of the rinse liquid to the first major surface W1 from the first rinse liquid nozzle 50 of the first rinse liquid supplying unit 16 is thereby started as shown in FIG. 8A (first rinse liquid supplying step). The rinse liquid supplied to the first major surface W1 spreads across the entirety of the first major surface W1 due to the centrifugal force. The chemical liquid on the substrate W is thereby replaced by the rinse liquid (step S3: rinse liquid replacing step). The chemical liquid and the rinse liquid eliminated outside the substrate W by the centrifugal force are received by the first guard 13.

The first rinse liquid valve 52 is then closed and the organic solvent valve 82 is opened. Supplying of the organic solvent to the first major surface W1 from the organic solvent nozzle 80 of the organic solvent supplying unit 19 is thereby started as shown in FIG. 8B (organic solvent supplying step). The organic solvent supplied to the first major surface W1 spreads across the entirety of the first major surface W1 due to the centrifugal force. The rinse liquid on the substrate W is thereby replaced by the organic solvent (step S4: organic solvent replacing step). The rinse liquid and the organic solvent eliminated outside the substrate W by the centrifugal force are received by the first guard 13.

While the organic solvent is being supplied to the first major surface W1, the coating agent nozzle moving unit 38 moves the coating agent nozzle 60 to the central position. Also, the first guard raising/lowering unit 36 moves the first guard 13 to the lower position. After the organic solvent is supplied to the first major surface W1 for a fixed time, the organic solvent valve 82 is closed and the coating agent valve 62 is opened. Supplying of the coating agent to the first major surface W1 from the coating agent nozzle 60 of the coating agent supplying unit 17 is thereby started as shown in FIG. 8C (step S5: coating agent supplying step). The coating agent supplied to the first major surface W1 spreads across the entirety of the first major surface W1 due to the centrifugal force. The organic solvent on the substrate W is thereby replaced by the coating agent. The first major surface W1 of the substrate W is thereby covered by a liquid film 90 of the coating agent. The rinse liquid and the coating agent eliminated outside the substrate W by the centrifugal force are received by the second guard 14.

The coating agent supplied from the coating agent nozzle 60 to the first major surface W1 of the substrate W may flow around to the second major surface W2 of the substrate W from a peripheral edge portion of the first major surface W1. Also, the coating agent that splashes outside the first major surface W1 of the substrate W may splash back from the guard 13 and 14 and become attached to a peripheral edge portion of the second major surface W2. Thus, after the first major surface W1 is covered by the liquid film 90 of the coating agent, the coating agent valve 62 is closed and the removing liquid valve 72 is opened instead. The removing liquid is thereby supplied from the removing liquid nozzle 70 of the removing liquid supplying unit 18 to the peripheral edge portion of the second major surface W2 of the substrate W as shown in FIG. 8D (removing liquid supplying step). By the removing liquid discharged from the removing liquid nozzle 70 being supplied to the peripheral edge portion of the second major surface W2 of the substrate W, the peripheral edge portion of the second major surface W2 is cleaned (step S6: peripheral edge cleaning step). Contamination of the second major surface W2 by the coating agent can thus be suppressed. The removing liquid supplying unit 18 thus functions as a peripheral edge cleaning unit.

While the removing liquid is being discharged from the removing liquid nozzle 70, the coating agent nozzle 60 is moved to the retreat position. Thereafter, the removing liquid valve 72 is closed and the second guard 14 is moved to the lower position. The electric motor 23 then stops the rotation of the substrate W. The suction valve 28 is then closed.

Referring to FIG. 2, the shutter 32 is thereafter opened again by the shutter opening/closing unit 33. The transfer robot CR then accesses the first liquid processing unit M1 via the inlet/outlet 31 and carries out the substrate W from the first liquid processing unit M1 (step S7: first carry-out step).

Referring to FIG. 4, the substrate W is then carried into the first heating unit D1 by the transfer robot CR (step S8: second carry-in step). In this process, the transfer robot CR is enabled to enter into the first heating unit D1 by the first lid portion driving unit 214 positioning the first movable lid portion 212 at the upper position. The substrate W is then held horizontally by the first substrate holder 200 (second substrate holding step). Specifically, after the substrate W is delivered onto the plurality of first lift pins 203 that are disposed at the upper position, the first lift pins 203 are moved to the lower position by the first lift pin raising/lowering unit 216. The substrate W is thereby placed on an upper surface of the first substrate holder 200. The transfer robot CR then retreats from the first heating unit D1. Thereafter, the first lid portion driving unit 214 positions the first movable lid portion 212 at the lower position. The chamber R3 is thereby closed.

At the first heating unit D1, the substrate W is heated as shown in FIG. 8E by the first heater 201 incorporated in the first substrate holder 200 (step S9: first substrate heating step). The coating agent covering the first major surface W1 of the substrate W is thereby solidified (solidifying step). In detail, the solvent contained in the coating agent evaporates and just a solid component remains on the first major surface W1. A sublimating coating film 250, covering the first major surface W1 of the substrate W, is thereby formed (coating film forming step). By the solidifying step being executed, the coating film 250 can be formed reliably.

The peripheral edge cleaning step described above is performed before start of the solidifying step. The peripheral edge portion of the second major surface W2 is thus cleaned before the coating agent is solidified by the solidifying step. The peripheral edge portion of the second major surface W2 is thus more readily cleaned in comparison to a case of cleaning the peripheral edge portion of the second major surface W2 after the coating agent is solidified.

Referring to FIG. 4, the first movable lid portion 212 is then positioned at the upper position by the first lid portion driving unit 214 and the plurality of first lift pins 203 are moved to the upper position by the first lift pin raising/lowering unit 216. The transfer robot CR then receives the substrate W from the plurality of first lift pins 203 and carries out the substrate W from the first heating unit (step S10: second carry-out step).

Referring also to FIG. 3, the substrate W is then carried by the transfer robot CR into a second liquid processing unit M2 (step S11: third carry-in step). The substrate W carried into the second liquid processing unit M2 is passed from the transfer robot CR onto the second spin chuck 100. Substrate W is gripped by the plurality of chuck pins 120 in a state where the first major surface W1 is faced upward. The substrate W is thereby held horizontally by the second spin chuck 100 (third substrate holding step). Thereafter, the substrate W is maintained in the state of being held horizontally until it is carried out from the second liquid processing unit M2 by the transfer robot CR.

The electric motor 123 then starts rotation of the substrate W. The third guard 102 is then disposed at the upper position by the guard raising/lowering unit 136.

Referring to FIG. 8F, at the second liquid processing unit M2, the second major surface W2 is cleaned by the cleaning liquid (step S12: second major surface cleaning step). Specifically, the second cleaning liquid valve 152 is opened. The cleaning liquid is thereby supplied from the second cleaning liquid nozzle 150 of the second cleaning liquid supplying unit 104 toward the second major surface W2 of the substrate W (second cleaning liquid supplying step). The cleaning liquid supplied to the second major surface W2 spreads across an entirety of the second major surface W2 due to a centrifugal force. The second major surface W2 is thereby cleaned. The second cleaning liquid supplying unit 104 thus functions as a second major surface cleaning unit. The cleaning liquid splashed outside the substrate W by the centrifugal force is received by the third guard 102. The second major surface cleaning step is performed after the end of the coating film forming step.

Then, after the cleaning liquid is supplied to the second major surface W2 for a fixed time, the second cleaning liquid valve 152 is closed. Thereafter, the first cleaning liquid valve 142 is opened as shown in FIG. 8G. The cleaning liquid is thereby supplied from the first cleaning liquid nozzle 140 of the first cleaning liquid supplying unit 103 toward a front surface of the coating film 250 (first cleaning liquid supplying step). The front surface of the coating film 250 is thereby cleaned (step S13: coating film cleaning step). The coating film cleaning step is thus started after end of the second major surface cleaning step. That is, the coating film cleaning step includes a first cleaning step of cleaning the front surface of the coating film 250 after the end of the second major surface cleaning step. The first cleaning liquid supplying unit 103 is thus included in a coating film cleaning unit.

The first cleaning liquid valve 142 is then closed. In its place, the second rinse liquid valve 162 and the third rinse liquid valve 172 are opened. Supplying of the rinse liquid from the second rinse liquid nozzle 160 of the second rinse liquid supplying unit 105 to the first major surface W1 is thereby started. Strictly speaking, the rinse liquid is supplied to the front surface of the coating film 250 formed on the first major surface W1. The rinse liquid supplied to the front surface of the coating film 250 spreads across an entirety of the front surface of the coating film 250 due to the centrifugal force. The cleaning liquid on the coating film 250 is thereby replaced by the rinse liquid. Supplying of the rinse liquid from the third rinse liquid nozzle 170 of the third rinse liquid supplying unit 106 to the second major surface W2 is also started. The cleaning liquid on the second major surface W2 is thereby replaced by the rinse liquid. The cleaning liquid attached to both surfaces of the substrate W (strictly speaking, the front surface of the coating film 250 and the second major surface W2) is thus replaced by the rinse liquid (step S14: second rinse liquid replacing step).

Thereafter, the electric motor 123 rotates the substrate W at high speed to spin off the rinse liquid attached to the substrate W. The substrate W is thereby dried (S15: substrate drying step). The electric motor 123 then stops the rotation of the substrate W. The third guard raising/lowering unit 136 then moves the third guard 102 to the lower position.

Referring also to FIG. 3, the shutter 132 is thereafter opened again by the shutter opening/closing unit 133. The transfer robot CR then accesses the second liquid processing unit M2 via the inlet/outlet 131 and carries out the substrate W from the second liquid processing unit M2 (step S16: third carry-out step).

Referring also to FIG. 5, the substrate W is then carried into the second heating unit D2 by the transfer robot CR (step S17: second carry-in step). In this process, the transfer robot CR can enter into the second heating unit D2 because the second lid portion driving unit 314 positions the second movable lid portion 312 at the upper position. The substrate W is then held horizontally by the second substrate holder 300 (fourth substrate holding step). Specifically, after the substrate W is delivered onto the plurality of second lift pins 303 that are disposed at the upper position, the second lift pins 303 are moved to the lower position by the second lift pin raising/lowering unit 316. The substrate W is thereby placed on an upper surface of the second substrate holder 300. The transfer robot CR then retreats from the second heating unit D2. Thereafter, the second lid portion driving unit 314 positions the second movable lid portion 312 at the lower position. The chamber R4 is thereby closed.

At the second heating unit D2, the substrate W is heated as shown in FIG. 8H by the second heater 301 incorporated in the second substrate holder 300 (step S18: second substrate heating step). The coating film 250 covering the first major surface W1 of the substrate W is thereby sublimated (sublimating step). The sublimating step is executed after the end of the coating film cleaning step. The second heater 301 thus functions as a sublimating unit. The exhaust valve 318 may be opened when heating the substrate W. The evacuating unit 304 thereby eliminates gas generated by sublimation of the coating film 250 to outside the inner space 313 of the chamber R4.

The second movable lid portion 312 is then positioned at the upper position by the second lid portion driving unit 314 and the plurality of second lift pins 303 are moved to the upper position by the second lift pin raising/lowering unit 316. The transfer robot CR then receives the substrate W from the plurality of second lift pins 303 and carries out the substrate W from the second heating unit D2 (step S19: fourth carry-out step).

How the coating film 250 changes before and after the coating film cleaning step shall now be described. FIG. 9A is a schematic sectional view of a vicinity of the first major surface W1 of the substrate W immediately before the coating film cleaning step (step S13 of FIG. 7) is started. FIG. 9B is a schematic sectional view of the vicinity of the first major surface W1 of the substrate W immediately after the coating film cleaning step ends.

The coating film 250 is preferably formed such that a thickness T1 of the coating film 250 is greater than a height T2 of a metal pattern P formed on the first major surface W1 as shown in FIG. 9A.

Here, the cleaning liquid that landed on the second major surface W2 in the second major surface cleaning step may float around the substrate W and become attached to a front surface 251 of the coating film 250. The cleaning liquid that landed on the second major surface W2 may also splash toward a member (the third guard 102, etc.) disposed around the substrate W and be splashed back by the member and become attached to the front surface 251 of the coating film 250 (see arrows in FIG. 8F). Further, the cleaning liquid that landed on the second major surface W2 may also flow around from a peripheral edge portion of the second major surface W2 to the first major surface W1 side and become attached to the front surface 251 of the coating film 250. The cleaning liquid that landed once on the second major surface W2 may contain a contaminant, such as a particle 256, etc. The particle 256 is even more likely to be contained in a liquid droplet 255 of the cleaning liquid that is splashed back by a member included in the substrate processing apparatus 1.

The liquid droplet 255, the particle 256 contained in the liquid droplet 255, etc., are attached to the front surface 251 of the coating film 250 before the coating film cleaning step. The particle 256 attached to the front surface 251 of the coating film 250 is not restricted to that which is contained in the liquid droplet 255 of the cleaning liquid that splashed outside the substrate W in the second major surface cleaning step. A particle 257 may become attached to the front surface 251 of the coating film 250, due to some cause besides the second major surface cleaning step, at some point between the supplying of the coating agent to the first major surface W1 of the substrate W and the start of the coating film cleaning step.

In the coating film cleaning step, the liquid droplet 255 and the particles 256 and 257 are removed from the front surface 251 of the coating film 250. The cleaning liquid supplied to the front surface 251 of the coating film 250 in the coating film cleaning step may be a liquid that dissolves a surface layer 252 of the coating film 250.

If the cleaning liquid used in the coating film cleaning step is a liquid that dissolves the surface layer 252 of the coating film 250, the particles 256 and 257 attached to the front surface 251 are removed together with the surface layer 252 as shown in FIG. 9B by the coating film cleaning step (surface layer removing step). Here, the particles 256 and 257 may be attached firmly to the front surface 251 of the coating film 250 and it may be difficult to remove the particles 256 and 257 from the front surface 251 of the coating film 250. Even in such a case, the front surface 251 of the coating film 250 can be cleaned reliably by removing the particles 256 and 257 together with the surface layer 252 of the coating film 250 in the coating film cleaning step.

By the surface layer removing step being executed, the coating film 250 becomes thin and a new front surface 253 is formed further to the first major surface W1 side than the front surface 251. Preferably, the coating film cleaning step is performed such that the thickness T1 of the coating film 250 is greater than the height T2 of the metal pattern P even after the coating film cleaning step. A step of removing the surface layer 252 of the coating film 250 may thus be executed in the coating film cleaning step.

The cleaning liquid supplied to the front surface 251 of the coating film 250 in the coating film cleaning step may, unlike in the present substrate processing, be a liquid that does not dissolve the surface layer 252 of the coating film 250.

As described above, with the present preferred embodiment, the substrate processing apparatus 1 includes the substrate holding units (the first spin chuck 10, the second spin chuck 100, the first substrate holder 200, and the second substrate holder 300), the coating agent supplying unit 17, supplying the coating agent to the first major surface W1, the coating film cleaning unit (first cleaning liquid supplying unit 103), cleaning the front surface of the coating film 250 covering the first major surface W1, and the controller 3. And the controller 3 executes the substrate holding steps (first to fourth substrate holding steps) of making the first spin chuck 10, the second spin chuck 100, the first substrate holder 200, and the second substrate holder 300 hold the substrate W horizontally, the coating film forming step of making the coating agent be supplied from the coating agent supplying unit 17 to the first major surface W1 to form the coating film 250, and the coating film cleaning step of making the first cleaning liquid supplying unit 103 clean the front surface of the coating film 250.

The sublimating coating film 250 is formed thus in the coating film forming step. Therefore, the coating film 250 can be removed from the first major surface W1 without using a liquid for removing the coating film 250 from the first major surface W1. Collapse of the metal pattern P due to supplying of liquid can thus be suppressed. Also, in the coating film cleaning step, the front surface of the coating film 250 is cleaned. Therefore, even if the coating film 250 is sublimated after the coating film cleaning step, the contaminants (the liquid droplet 255 of the cleaning liquid and the particles 256 and 257) attached to the front surface 251 of the coating film 250 can be suppressed from remaining on the first major surface W1. Contamination of the first major surface W1 of the substrate W can thus be suppressed.

Also, with the first preferred embodiment, the substrate processing apparatus 1 further includes the second cleaning liquid supplying unit 104 (second major surface cleaning unit) that cleans the second major surface W2. Also, the controller 3 further executes the second major surface cleaning step of making the second cleaning liquid supplying unit 104 clean the second major surface W2 after the end of the coating film forming step. Further, the controller 3 starts the coating film cleaning step (first cleaning step) after the end of the second major surface cleaning step.

The coating film cleaning step is thus started after the end of the second major surface cleaning step. Therefore, even if the cleaning liquid attaches to the front surface 251 of the coating film 250 due to the second major surface cleaning step, the front surface 251 of the coating film 250 is cleaned in the coating film cleaning step. Contamination of the first major surface W1 can thus be suppressed in the substrate processing apparatus 1 in which the second major surface W2 is cleaned by the second major surface cleaning step.

Here, a predetermined time is required for the cleaning liquid that landed on the second major surface W2 to reach the front surface 251 of the coating film 250 and therefore after the end of the second major surface cleaning step, there is a possibility of the cleaning liquid becoming attached to the front surface 251 of the coating film 250 until the predetermined time elapses. With an arrangement where the cleaning of the front surface 251 of the coating film 250 is started after the second major surface cleaning step as in the present substrate processing apparatus 1, the cleaning liquid attached to the front surface 251 of the coating film 250 due to the second major surface cleaning step can be removed reliably. Also, even if a contaminant (the particle 257) is attached to the front surface 251 of the coating film 250 from before start of the second major surface cleaning step, the contaminant (the particle 257) can be removed at the same time as the liquid droplet 255 of the cleaning liquid (and the particle 256) attached to the front surface 251 of the coating film 250 due to the second major surface cleaning step.

Also, with the first preferred embodiment, the first cleaning liquid supplying unit 103 is included in a first major surface cleaning unit. Also, the controller 3 executes, in the coating film cleaning step, the step of making the cleaning liquid be supplied from the first cleaning liquid supplying unit 103 toward the first major surface W1 to clean the front surface 251 of the coating film 250 (first cleaning liquid supplying step).

The cleaning liquid supplied to the front surface 251 of the coating film 250 in the coating film cleaning step thus spreads on the front surface 251 of the coating film 250. A cleaning time of the front surface 251 of the coating film 250 can thus be reduced.

Also, with the first preferred embodiment, the substrate processing apparatus 1 further includes the second heater 301 (sublimating unit) that sublimates the coating film 250. Also, the controller 3 executes the sublimating step, in which the coating film 250 is sublimated by the second heater 301, after the end of the coating film cleaning step. Therefore, the coating film 250 is sublimated and the first major surface W1 becomes exposed. The front surface 251 of the coating film 250 is cleaned in the coating film cleaning step and therefore a contaminant attached to the front surface of the coating film 250 can be suppressed from remaining on the first major surface W1 after sublimation of the coating film 250. That is, contamination of the first major surface W1 is suppressed.

Also, with the first preferred embodiment, the metal pattern P is formed on the first major surface W1. Therefore, with the substrate processing apparatus 1 of the arrangement where the sublimating coating film 250 is formed on the first major surface W1 and the front surface 251 of the coating film 250 is cleaned, contamination of the first major surface W1 can be suppressed while suppressing collapse of the metal pattern P.

The substrate processing by the substrate processing apparatus 1 according to the first preferred embodiment is not restricted to the example described above. The substrate processing by the substrate processing apparatus 1 according to the first preferred embodiment may be of the examples described below.

FIG. 10 is an illustrative sectional view for describing a second example of substrate processing by the substrate processing apparatus 1. As shown in FIG. 10, in the substrate processing by the substrate processing apparatus 1, the coating film cleaning step (step S13 of FIG. 7) and the second major surface cleaning step (step S12 of FIG. 7) may be executed in parallel. That is, the coating film cleaning step includes a second cleaning step of cleaning the front surface of the coating film 250 in parallel with the second major surface cleaning step. The cleaning liquid attached to the front surface of the coating film 250 due to the second major surface cleaning step can thus be removed immediately. If a contaminant is already attached to the front surface of the coating film 250 before the start of the second major surface cleaning step, removal of the contaminant can be started before the cleaning liquid that landed on the second major surface W2 reaches the front surface of the coating film 250. Further, time until the end of the coating film cleaning step can also be shortened. The number of substrates that can be processed per unit time can thus be increased. That is, improvement of throughput can be achieved, and contamination of the first major surface W1 can thus be suppressed while achieving improvement of throughput.

The second cleaning step is preferably continued even after the end of the second major surface cleaning step. As mentioned above, the predetermined time is required for the cleaning liquid that landed on the second major surface W2 to reach the front surface of the coating film 250 and therefore after the end of the second major surface cleaning step, there is a possibility of the cleaning liquid becoming attached to the front surface of the coating film 250 until the predetermined time elapses. Thus, by ending the second cleaning step after the end of the second major surface cleaning step as in the substrate processing of the present second example, attachment of contaminated cleaning liquid to the front surface of the coating film 250 after the end of the coating film cleaning step can be suppressed further.

Figure 11A:
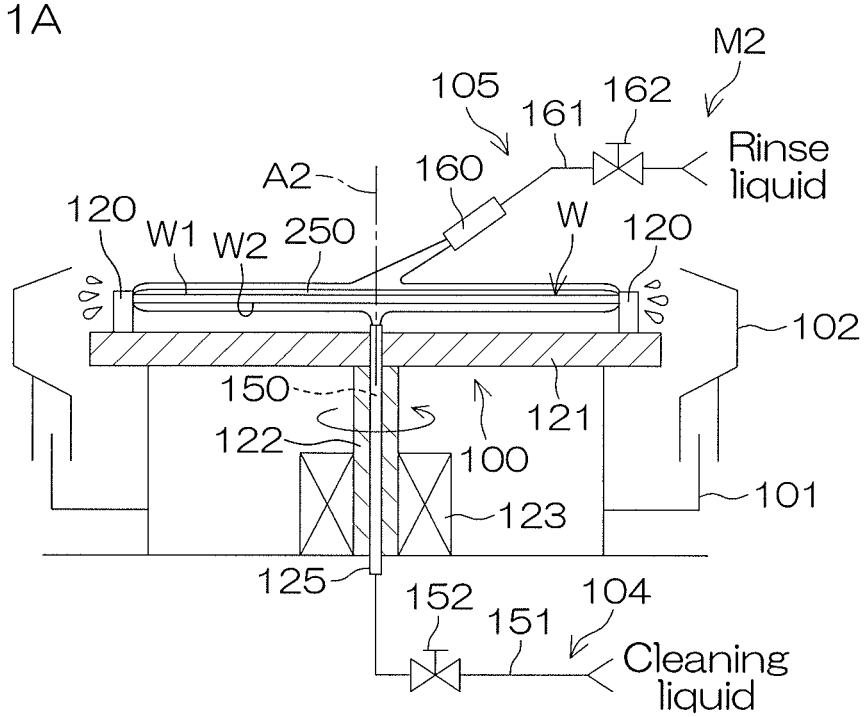
FIG. 11A and FIG. 11B are illustrative sectional views for describing a third example of substrate processing by the substrate processing apparatus.
Figure 11B:
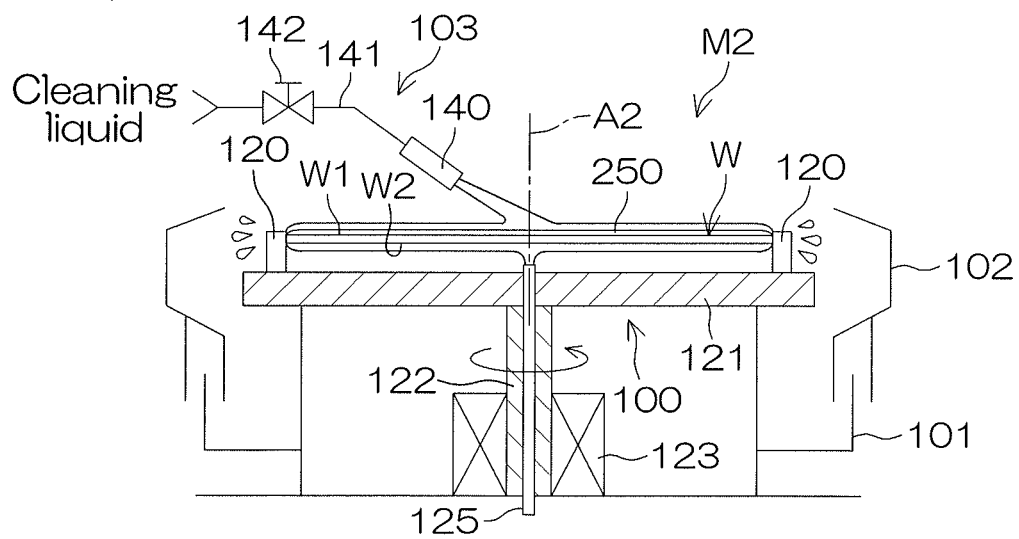

FIG. 11A and FIG. 11B are illustrative sectional views for describing a third example of substrate processing by the substrate processing apparatus 1. As shown in FIG. 11A, in the substrate processing by the substrate processing apparatus 1, the rinse liquid may be supplied from the second rinse liquid nozzle 160 toward the front surface of the coating film 250 in parallel with the second major surface cleaning step (step S12 of FIG. 7). Attachment of a liquid droplet, splashing from the substrate W during the second major surface cleaning step, to the front surface of the coating film 250 is thereby suppressed. In other words, the coating film 250 is protected by the rinse liquid discharged from the second rinse liquid nozzle 160. The rinse liquid discharged from the second rinse liquid nozzle 160 thus functions as a protective liquid that protects the front surface of the coating film 250. That is, a protective liquid supplying step of supplying the protective liquid to the front surface of the coating film 250 is executed in parallel with the second major surface cleaning step. Preferably, the protective liquid supplying step does not end at the same time as the end of the second major surface cleaning step but ends after the end of the second major surface cleaning step.

As shown in FIG. 11B, the supplying of the rinse liquid from the second rinse liquid nozzle 160 is then stopped before the supplying of the cleaning liquid from the first cleaning liquid nozzle 140 to the front surface of the coating film 250 is started. That is, the protective liquid supplying step is executed before the start of the coating film cleaning step (step S13 of FIG. 7).

With the substrate processing of the third example, attachment of contaminated cleaning liquid to the front surface of the coating film 250 is suppressed by the protective liquid. Contamination of the first major surface W1 can thus be suppressed.

Figure 12A:
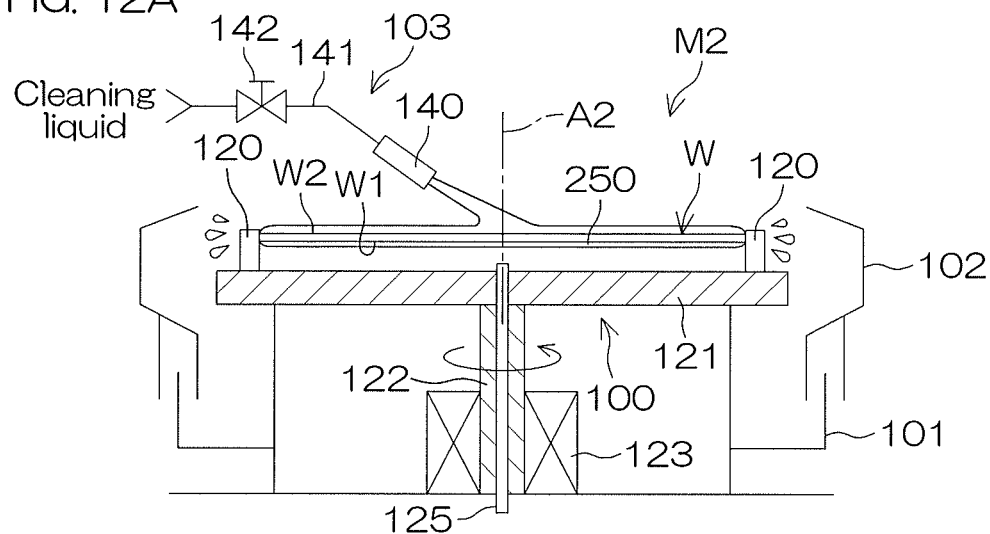
FIG. 12A and FIG. 12B are illustrative sectional views for describing a fourth example of substrate processing by the substrate processing apparatus.
Figure 12B:
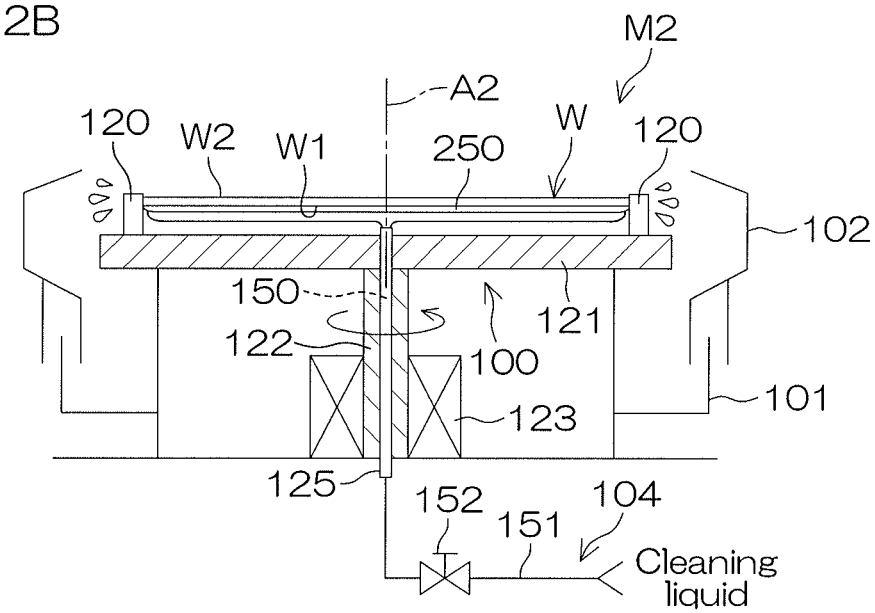

FIG. 12A and FIG. 12B are illustrative sectional views for describing a fourth example of substrate processing by the substrate processing apparatus 1. As shown in FIG. 12A and FIG. 12B, in the substrate processing by the substrate processing apparatus 1, the substrate W may be held by the second spin chuck 100 of the second liquid processing unit M2 such that the second major surface W2 is the upper surface. In the present substrate processing, the cleaning liquid is supplied from the first cleaning liquid nozzle 140 of the first cleaning liquid supplying unit 103 toward the second major surface W2 in the second major surface cleaning step (step S12 of FIG. 7). Also, in the coating film cleaning step (step S13 of FIG. 7), the cleaning liquid is supplied from the second cleaning liquid nozzle 150 of the second cleaning liquid supplying unit 104 toward the front surface of the coating film 250. Thus, in the present substrate processing, the first cleaning liquid supplying unit 103 functions as the second major surface cleaning unit and the second cleaning liquid supplying unit 104 functions as the coating film cleaning unit (cleaning liquid supplying unit).

Also, in the present substrate processing, in the second rinse liquid replacing step (step S14 of FIG. 7), the rinse liquid is supplied from the second rinse liquid nozzle 160 toward the second major surface W2 and the rinse liquid is supplied from the third rinse liquid nozzle 170 toward the first major surface W1.

Second Preferred Embodiment

Figure 13:
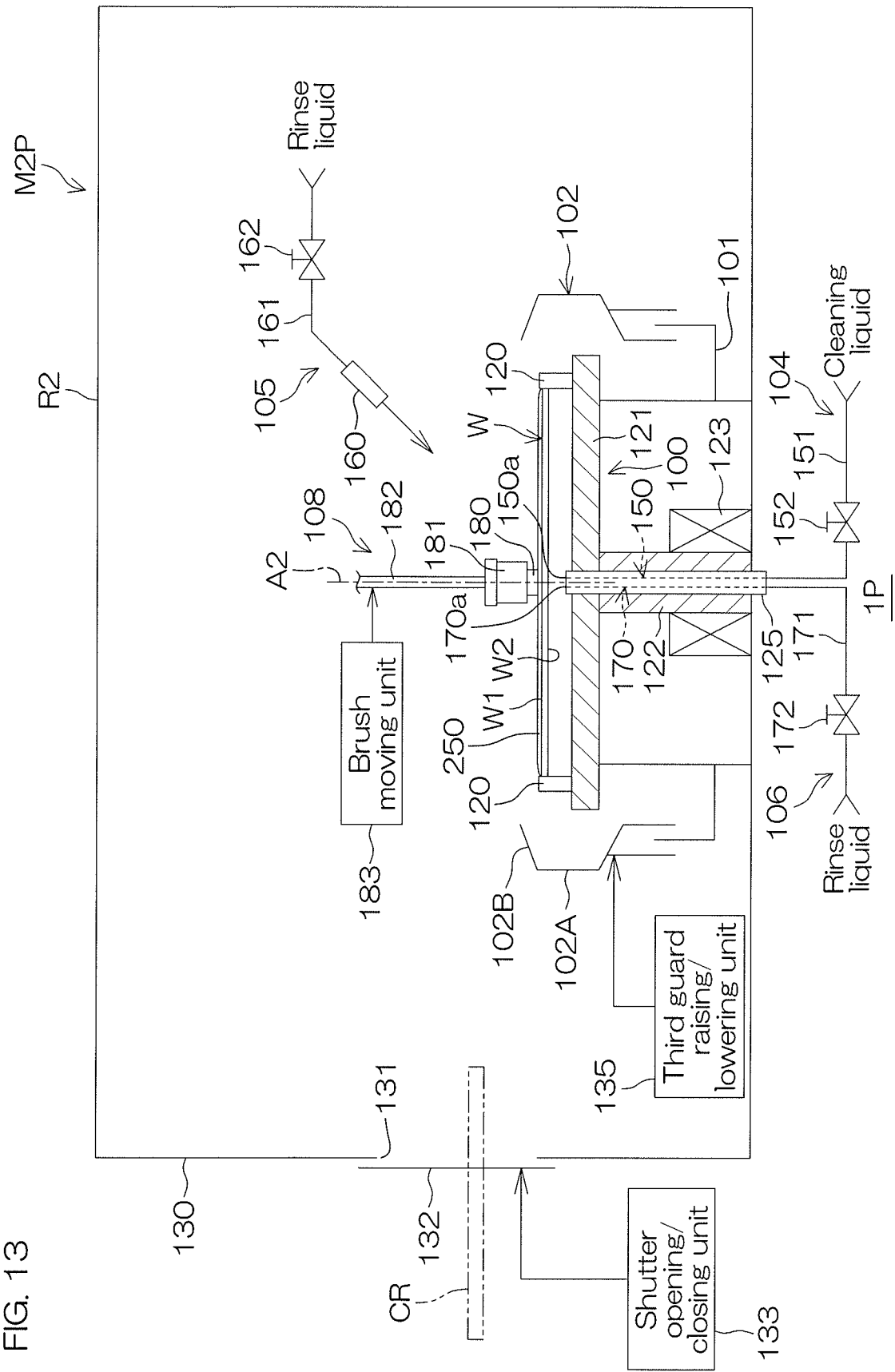
FIG. 13 is an illustrative sectional view for describing a configuration example of a second liquid processing unit included in a substrate processing apparatus according to a second preferred embodiment.

FIG. 13 is an illustrative sectional view for describing a configuration example of a second liquid processing unit M2P included in a substrate processing apparatus 1P according to a second preferred embodiment. In FIG. 13, members that are the same as the members described up to now are provided with the same reference symbols and description thereof shall be omitted.

A point by which the second liquid processing unit M2P mainly differs from the second liquid processing unit M2 of the first preferred embodiment (see FIG. 3) is that the second liquid processing unit M2P includes a brush unit 108 in places of the first cleaning liquid supplying unit 103. The brush unit 108 is a unit that cleans the upper surface of the substrate W by rubbing a brush 180 against the upper surface of the substrate W. The brush unit 108 includes a brush 180, configured to clean the upper surface of the substrate W, a brush holder 181, disposed above the brush 180, and a brush arm 182, supporting the brush holder 181.

The brush 180 is an elastically deformable sponge brush prepared with a synthetic resin, such as PVA (polyvinyl alcohol). The brush 180 projects downward from the brush holder 181. The brush 180 is not restricted to a sponge brush and may be a brush that includes bristle tufts formed of a plurality of fibers made of resin.

The brush 180 is moved in the horizontal direction and the vertical direction by a brush moving unit 183. The brush moving unit 183 moves the brush 180 between a central position and a retreat position by horizontal direction movement. When the brush 180 is positioned at the central position, it faces the rotation center position of the upper surface of the substrate W from the vertical direction. When the brush 180 is positioned at the retreat position, it does not face the upper surface of the substrate W from the vertical direction. The brush moving unit 183 is controlled by the controller 3 (see FIG. 6).

With the substrate processing apparatus 1P, substantially the same substrate processing as that executed with the substrate processing apparatus 1 is executed with the exception of the coating film cleaning step (step S13 of FIG. 7). In the coating film cleaning step of the substrate processing by the substrate processing apparatus 1P, the front surface of the coating film 250 is scrub-cleaned by the brush unit 108. Specifically, the brush moving unit 183 moves the brush arm 182 and presses the brush 180 against the front surface of the coating film 250. The substrate W is rotating and therefore the brush 180 is rubbed against the front surface of the coating film 250. The coating film 250 can thus be cleaned even more reliably. Thus, in the substrate processing by the substrate processing apparatus 1P, the brush unit 108 functions as the coating film cleaning unit. When the brush 180 cleans the coating film 250, the surface layer 252 of the coating film 250 may be removed as in the substrate processing by the substrate processing apparatus 1 according to the first preferred embodiment (see FIG. 9A and FIG. 9B).

The same effects as those of the first preferred embodiment are exhibited by the second preferred embodiment.

Also, in the substrate processing by the substrate processing apparatus 1P, the substrate W may be held by the second spin chuck 100 of the second liquid processing unit M2P such that the second major surface W2 is the upper surface as in the fourth example of substrate processing by the substrate processing apparatus 1 according to the first preferred embodiment. In the present substrate processing, the second major surface W2 is scrub-cleaned by the brush 180 in the second major surface cleaning step (step S12 of FIG. 7). Also, in the coating film cleaning step (step S13 of FIG. 7), the cleaning liquid is supplied from the second cleaning liquid nozzle 150 toward the front surface of the coating film 250. Thus, in the present substrate processing, the brush unit 108 functions as the second major surface cleaning unit, and the second cleaning liquid supplying unit 104 functions as the coating film cleaning unit (cleaning liquid supplying unit).

Also, in the second rinse liquid replacing step (step S14 of FIG. 7), the rinse liquid is supplied from the second rinse liquid nozzle 160 toward the second major surface W2 and the rinse liquid is supplied from the third rinse liquid nozzle 170 toward the first major surface W1.

Third Preferred Embodiment

Figure 14:
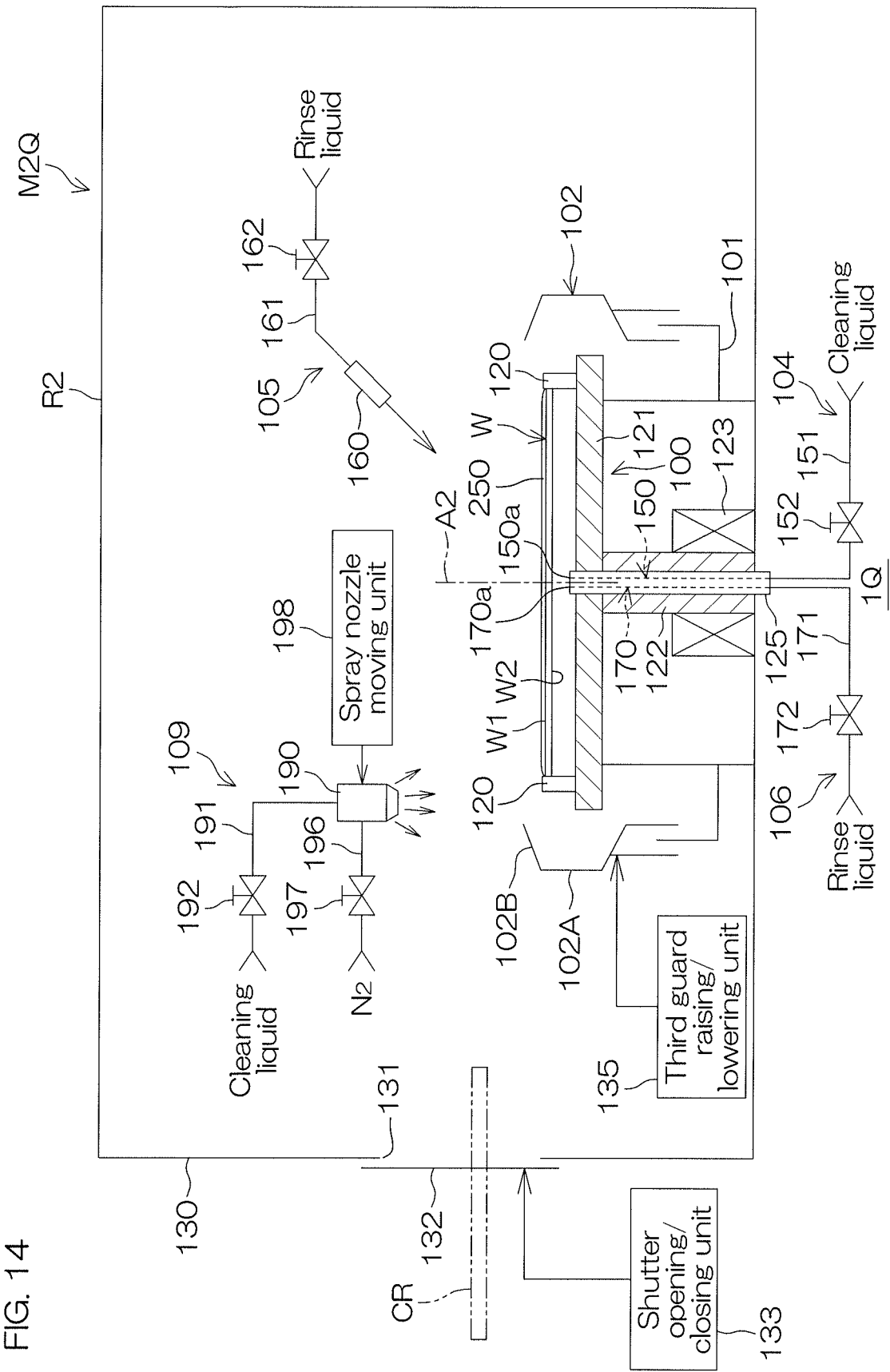
FIG. 14 is an illustrative sectional view for describing a configuration example of a second liquid processing unit included in a substrate processing apparatus according to a third preferred embodiment.

FIG. 14 is an illustrative sectional view for describing an arrangement example of a second liquid processing unit M2Q included in a substrate processing apparatus 1Q according to a third preferred embodiment. In FIG. 14, members that are the same as the members described up to now are provided with the same reference symbols and description thereof shall be omitted.

A point by which the second liquid processing unit M2Q mainly differs from the second liquid processing unit M2 of the first preferred embodiment (see FIG. 3) is that the second liquid processing unit M2P includes a third cleaning liquid supplying unit 109 in place of the first cleaning liquid supplying unit 103.

The third cleaning liquid supplying unit 109 includes a double-fluid nozzle 190, a third cleaning liquid supplying pipe 191, a third cleaning liquid valve 192, a gas supplying pipe 196, and a gas valve 197. The double-fluid nozzle 190 mixes and discharges a cleaning liquid, such as SC1, etc., and a gas, such as nitrogen gas ($N_2$), etc. The third cleaning liquid supplying pipe 191 and the gas supplying pipe 196 are coupled to the double-fluid nozzle 190. The cleaning liquid is supplied from a third cleaning liquid supplying source to the third cleaning liquid supplying pipe 191. The third cleaning liquid valve 192 opens and closes a flow passage inside the third cleaning liquid supplying pipe 191. The gas, such as nitrogen gas, etc., is supplied from a gas supplying source to the gas supplying pipe 196. The gas valve 197 opens and closes a flow passage inside the gas supplying pipe 196. The third cleaning liquid valve 192 and the gas valve 197 are controlled by a controller 3 (see FIG. 6).

The cleaning liquid supplied from the third cleaning liquid supplying source to the third cleaning liquid supplying pipe 191 is not restricted to SC1. The cleaning liquid discharged from the double-fluid nozzle 190 may be an ammonia-containing liquid other than SC1.

As the gas supplied from the gas supplying source to the gas supplying pipe 196, an inert gas, such as nitrogen gas, etc., is preferable. The inert gas is not restricted to nitrogen gas and refers to a gas that is inert with respect to the upper surface and the pattern of the substrate W. As examples of the inert gas, noble gases, such as argon, etc., can be cited other than nitrogen gas.

The double-fluid nozzle 190 is moved in the vertical direction and the horizontal direction by a double-fluid nozzle moving unit 198. The double-fluid nozzle moving unit 198 moves the double-fluid nozzle 190 between a central position and a retreat position by horizontal direction movement. When the double-fluid nozzle 190 is positioned at the central position, a discharge port 190a provided in the double-fluid nozzle 190 faces the rotation center position of the upper surface of the substrate W from the vertical direction. When the double-fluid nozzle 190 is positioned at the retreat position, the discharge port 190a does not face the upper surface of the substrate W from the vertical direction. The double-fluid nozzle moving unit 198 is controlled by the controller 3 (see FIG. 6).

With the substrate processing apparatus 1Q, substantially the same substrate processing as that executed with the substrate processing apparatus 1 is executed. In the substrate processing by the substrate processing apparatus 1Q, the third cleaning liquid supplying unit 109 is used in the step in the substrate processing by the substrate processing apparatus 1 in which the first cleaning liquid supplying unit 103 is used. For example, in the coating film cleaning step, liquid droplets of the cleaning liquid are sprayed together with the gas onto the front surface of the coating film 250 from the discharge port 190a of the double-fluid nozzle 190. The front surface of the coating film 250 is thereby scrub-cleaned. The coating film 250 can thus be cleaned even more reliably. The third cleaning liquid supplying unit 109 thus functions as the coating film cleaning unit. When the double-fluid nozzle 190 cleans the coating film 250, the surface layer 252 of the coating film 250 may be removed as in the substrate processing by the substrate processing apparatus 1 according to the first preferred embodiment (see FIG. 9A and FIG. 9B).

Also, the same effects as those of the first preferred embodiment are exhibited by the third preferred embodiment.

Also, in the substrate processing by the substrate processing apparatus 1Q, the substrate W may be held by the second spin chuck 100 of the second liquid processing unit M2P such that the second major surface W2 is the upper surface as in the fourth example of substrate processing by the substrate processing apparatus 1 according to the first preferred embodiment. In the present substrate processing, the cleaning liquid is supplied from the double-fluid nozzle 190 toward the second major surface W2 in the second major surface cleaning step (step S12 of FIG. 7). Also, in the coating film cleaning step (step S13 of FIG. 7), the cleaning liquid is supplied from the second cleaning liquid nozzle 150 toward the front surface of the coating film 250. Thus, in the present substrate processing, the third cleaning liquid supplying unit 109 functions as the second major surface cleaning unit, and the second cleaning liquid supplying unit 104 functions as the coating film cleaning unit (cleaning liquid supplying unit).

Also, in the second rinse liquid replacing step (step S14 of FIG. 7), the rinse liquid is supplied from the second rinse liquid nozzle 160 toward the second major surface W2 and the rinse liquid is supplied from the third rinse liquid nozzle 170 toward the first major surface W1.

The same substrate processing as each of the second example and the third example of substrate processing by the substrate processing apparatus 1 according to the first preferred embodiment can also be performed by the substrate processing apparatus 1Q of the third preferred embodiment. Even in such cases, the third cleaning liquid supplying unit 109 is obviously used in place of the first cleaning liquid supplying unit 103.

Fourth Preferred Embodiment

Figure 15:
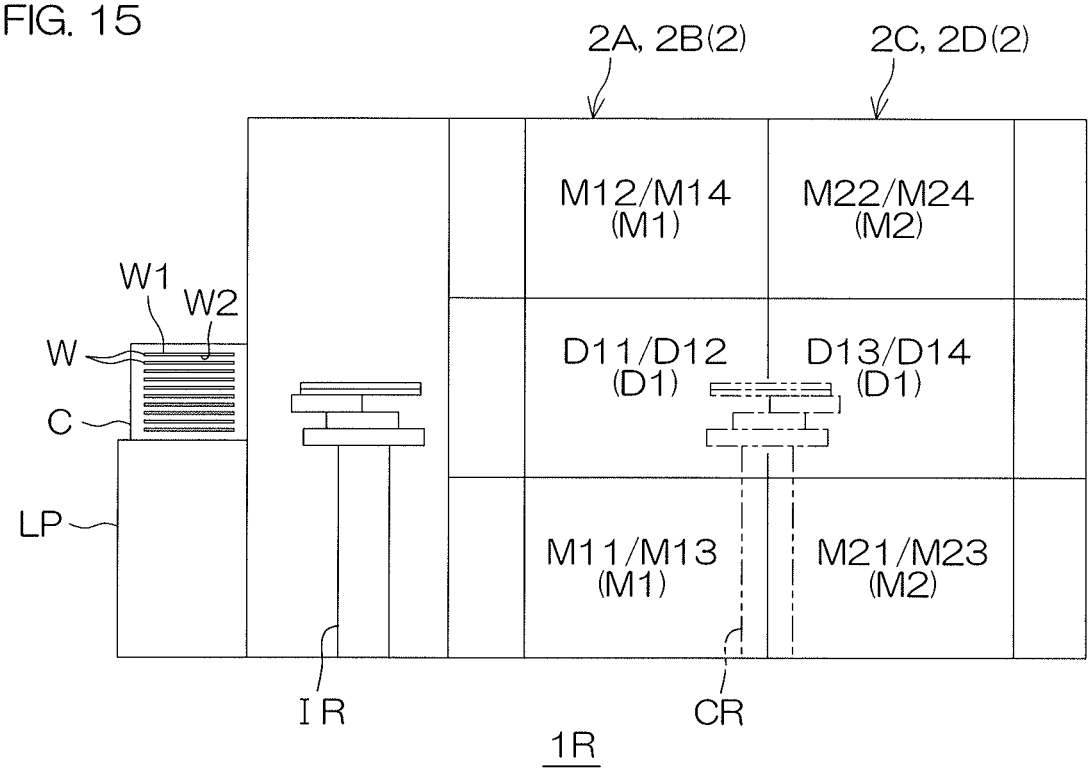
FIG. 15 is an illustrative elevation view for describing a configuration of a substrate processing apparatus according to a fourth preferred embodiment.

FIG. 15 is an illustrative elevation view for describing an arrangement of a substrate processing apparatus 1R according to a fourth preferred embodiment. In FIG. 15, members that are the same as the members described up to now are provided with the same reference symbols and description thereof shall be omitted.

A point by which the substrate processing apparatus 1R mainly differs from the substrate processing apparatus 1 of the first preferred embodiment (see FIG. 1B) is that the substrate processing apparatus 1R includes first heating units D13 and D14 in place of the second heating units D21 and D22. In detail, the third processing tower 2C includes the second liquid processing units M21 and M22 and the first heating unit D13. The fourth processing tower 2D includes the second liquid processing units M23 and M24 and the first heating unit D14. In the substrate processing by the substrate processing apparatus 1R, step S17 to step S19 of FIG. 7 are not executed. The coating film 250 formed on the first major surface W1 of the substrate W may be sublimated by a sublimating unit (for example, a plasma ashing apparatus), provided separately of the substrate processing apparatus 1R, after being taken out from the substrate processing apparatus 1R.

The present invention is not restricted to the preferred embodiments described above and may be implemented in yet other modes.

Unlike in the preferred embodiments described above, each of the substrate processing apparatuses 1, 1P, and 1Q may be provided with a plasma asher unit (sublimating unit), capable of removing the coating film 250, in place of the second heating unit D2.

Also, it is described that in the substrate processing by each of the substrate processing apparatuses 1, 1P, and 1Q of the preferred embodiments described above, the coating agent on the substrate W is solidified by heating the substrate W inside the first heating unit D1. However, unlike in the substrate processing described above, substrate processing of solidifying the coating agent on the substrate W may be executed by heating the substrate W inside the first liquid processing unit M1 or the second liquid processing unit M2. For this, a heater (not shown) that heats the substrate W must be provided inside the first liquid processing unit M1 or the second liquid processing unit M2. If a heater that heats the substrate W is provided inside the first liquid processing unit M1 or the second liquid processing unit M2, the first heating unit D1 does not have to be included in each of the substrate processing apparatuses 1, 1P, 1Q, and 1R.

Also, with each of the preferred embodiments described above, it is deemed that the coating agent is solidified by heating. However, the coating agent may be a coating agent (for example, a quick-drying coating agent) that solidifies at ordinary temperature. In that case, the first heating unit D1 does not have to be included in each of the substrate processing apparatuses 1, 1P, 1Q, and 1R. Also, the coating agent may be one that solidifies by being cooled. In that case, the substrate W may be cooled by the first cooling unit 202 included in the first heating unit D1 of each of the substrate processing apparatuses 1, 1P, 1Q, and 1R. Also, a processing liquid supplied to the substrate W after the coating film 250 is formed is preferably cooled.

Also, with each of the preferred embodiments described above, it is deemed that in the peripheral edge cleaning step (step S6 of FIG. 7), the peripheral edge portion of the second major surface W2 is cleaned by the removing liquid. However, if a substrate W, with which the metal pattern P is not formed at the peripheral edge portion of the first major surface W1, is used in the substrate processing, the peripheral edge portion of the first major surface W1 may also be cleaned by the removing liquid in addition to the peripheral edge portion of the second major surface W2 in the peripheral edge cleaning step (step S6 of FIG. 7). In this case, a removing liquid supplying unit (not shown) that supplies the removing liquid to the peripheral edge portion of the upper surface of the substrate W must be provided in the first liquid processing unit M1 of each of the substrate processing apparatuses 1, 1P, 1Q, and 1R.

Also, with each of the preferred embodiments described above, it is described that the front surface of the coating film 250 and the second major surface W2 are to be cleaned using the cleaning liquid, such as SC1, etc. However, if, unlike in the preferred embodiments described above, the front surface of the coating film 250 and the second major surface W2 can be cleaned sufficiently by supplying the rinse liquid, such as DIW, etc., to the front surface of the coating film 250 and the second major surface W2, there is no need to supply SC1, etc., to the front surface of the coating film 250 and the second major surface W2. That is, unlike in the preferred embodiments described above, substrate processing using the rinse liquid, such as DIW, etc., as the cleaning liquid may be executed. In this case, one of the second rinse liquid supplying unit 105 and the third rinse liquid supplying unit 106 functions as the coating film cleaning unit (cleaning liquid supplying unit), and the other of the second rinse liquid supplying unit 105 and the third rinse liquid supplying unit 106 functions as the second major surface cleaning unit.

While preferred embodiments of the present invention have been described in detail, these are merely specific examples used to clarify the technical contents of the present invention and the present invention should not be interpreted as being limited to these specific examples and the scope of the present invention are to be limited only by the appended claims.

The present application corresponds to Japanese Patent Application No. 2017-148111 filed on Jul. 31, 2017 in the Japan Patent Office, and the entire disclosure of this application is incorporated herein by reference.

What is claimed is:

1. A substrate processing method comprising:
   a substrate holding step of horizontally holding a substrate having a first major surface, on which a metal pattern is formed, and a second major surface at an opposite side of the first major surface;
   a coating film forming step of supplying a coating agent to the first major surface to form a sublimating coating film, which covers the first major surface, such that a thickness of the coating film is greater than a height of the metal pattern;
   a coating film cleaning step of cleaning a front surface of the coating film; and
   a sublimating step of sublimating the coating film by heating the substrate after an end of the coating film cleaning step,
   wherein the coating film cleaning step is a step of removing a surface layer of the coating film, such that, even after removing the surface layer, the coating film remains on the first major surface with a thickness greater than the height of the metal pattern and the metal pattern is not exposed, and
   the sublimating step is a step of removing all the coating film which remains on the first major surface even after removal of the surface layer of the coating film.

2. The substrate processing method according to claim 1, further comprising: a second major surface cleaning step of cleaning the second major surface after the end of the coating film forming step,
   wherein the coating film cleaning step is started after the end of the second major surface cleaning step or is executed in parallel with the second major surface cleaning step.

3. The substrate processing method according to claim 2, wherein the coating film cleaning step includes a first cleaning step of starting cleaning of the front surface of the coating film after the end of the second major surface cleaning step.

4. The substrate processing method according to claim 2, wherein the coating film cleaning step includes a second cleaning step of cleaning the front surface of the coating film in parallel with the second major surface cleaning step.

5. The substrate processing method according to claim 4, wherein the second cleaning step is ended after the end of the second major surface cleaning step.

6. The substrate processing method according to claim 2, further comprising: a protective liquid supplying step of supplying a protective liquid, which protects the front surface of the coating film, to the front surface of the coating film,
   wherein the protective liquid supplying step is executed in parallel with the second major surface cleaning step before the start of the coating film cleaning step.

7. The substrate processing method according to claim 1, wherein removal of the surface layer of the coating film in the coating film cleaning step is executed by supplying a cleaning liquid to the front surface of the coating film.

8. The substrate processing method according to claim 1, wherein the coating film forming step includes a solidifying step of heating the substrate, after the coating agent is supplied to the first major surface, to solidify the coating agent and form the coating film.

9. The substrate processing method according to claim 8, further comprising: a peripheral edge cleaning step of cleaning a peripheral edge of the second major surface before the start of the solidifying step.

10. The substrate processing method according to claim 1, wherein removal of the surface layer of the coating film in the coating film cleaning step is executed by scrub-cleaning the first major surface by a brush.

11. The substrate processing method according to claim 8, wherein a heating temperature of the substrate in the sublimating step is higher than a heating temperature of the heating in the solidifying.

12. The substrate processing method according to claim 11, wherein the solidifying includes a step of solidifying the coating agent by heating the substrate by a first heater, and the sublimating step includes a step of sublimating the coating film by heating the substrate by a second heater which is hotter than the first heater.

13. The substrate processing method according to claim 12, wherein the substrate holding step includes a step in which the substrate is held horizontally by a first substrate holding unit and a step in which the substrate is held horizontally by a second substrate holding unit, the method comprises a first transferring step of transferring the substrate from the first substrate holding unit to the first heater, a second transferring step of transferring the substrate from the first heater to the second substrate holding unit, and a third transferring step of transferring from the second substrate holding unit to the second heater, the coating film forming step includes a step of supplying the coating agent to the first major surface of the substrate held by the first substrate holding unit, and a step of solidifying the coating agent by heating the substrate by the first heater after transferring the substrate, which holds the coating agent on the first major surface, from the first substrate holding unit to the first heater, the coating film cleaning step includes a step of cleaning the front surface of the coating film after transferring the substrate in a state where the coating film is formed on the first major surface, from the first heater to the second substrate holding unit, and the sublimating step includes a step of heating the substrate by the second heater after transferring the substrate in a state where the coating film is cleaned, from the second substrate holding unit to the second heater.

14. The substrate processing method according to claim 1, further comprising: a second major surface cleaning step of cleaning the second major surface by supplying the cleaning liquid to the second major surface, after finishing the coating film forming step, a guard positioning step of positioning a guard, which receives the cleaning liquid splashed from the second major surface on the side of the substrate.

15. The substrate processing method according to claim 14, wherein the coating film cleaning step includes a step of washing away the cleaning liquid which is splashed back from the guard and adhered to the front surface of the coating film.

16. The substrate processing method comprising:

a substrate holding step of horizontally holding a substrate having a first major surface and a second major surface at an opposite side of the first major surface;

a coating film forming step of supplying a coating agent to the first major surface to form a sublimating coating film which covers the first major surface;

a coating film cleaning step of cleaning a front surface of the coating film; and a second major surface cleaning step of cleaning the second major surface after the end of the coating film forming step, wherein the coating film cleaning step is started after the end of the second major surface cleaning step or is executed in parallel with the second major surface cleaning step, the method further comprises a protective liquid supplying step of supplying a protective liquid, which protects the front surface of the coating film, to the front surface of the coating film, and the protective liquid supplying step is executed in parallel with the second major surface cleaning step before the start of the coating film cleaning step.

* * * * *